US006563157B2

(12) United States Patent
Fukuzumi

(10) Patent No.: US 6,563,157 B2
(45) Date of Patent: May 13, 2003

(54) SEMICONDUCTOR DEVICE HAVING RIGID CAPACITOR STRUCTURE WITH A LINER FILM

(76) Inventor: Yoshiaki Fukuzumi, c/o Intellectual Property Division, Kabushiki Kaisha Toshiba, 1-1 Shibaura 1-chome, Minato-ku, Tokyo 1-5-8001 (JP)

( * ) Notice: Subject to any disclaimer, the term of this patent is extended or adjusted under 35 U.S.C. 154(b) by 0 days.

(21) Appl. No.: 09/893,515

(22) Filed: Jun. 29, 2001

(65) Prior Publication Data
US 2002/0022317 A1 Feb. 21, 2002

(30) Foreign Application Priority Data
Jun. 30, 2000 (JP) ........................................ 2000-197795
Jun. 11, 2001 (JP) ........................................ 2001-175616

(51) Int. Cl.[7] ............................................. H01L 27/108
(52) U.S. Cl. ........................ 257/296; 257/298; 257/301
(58) Field of Search ................................. 257/906, 905, 257/908, 301–309, 295, 296, 298, 71, 754, 655, 398; 361/305, 306, 313; 438/238–243, 257, 396

(56) References Cited
U.S. PATENT DOCUMENTS 6,329,681 B1 * 12/2001 Nakamura et al. .......... 257/297
6,353,269 B1 *  3/2002 Huang ......................... 257/906

* cited by examiner

Primary Examiner—Carl Whitehead, Jr.
Assistant Examiner—Yennhu B. Huynh
(74) Attorney, Agent, or Firm—Banner & Witcoff, Ltd.

(57) ABSTRACT

A semiconductor device includes a contact plug formed in a first interlayer insulating film on a semiconductor substrate, a second interlayer insulating film formed on the first interlayer insulating film and having an opening formed therein to reach the first interlayer insulating film, a liner film formed on the bottom and side surfaces of the opening, a capacitor lower electrode of a stacked capacitor formed to be at least partly filled in the opening, the capacitor lower electrode being formed in contact with the first and second interlayer insulating films with the liner film disposed therebetween, a capacitor insulating film formed on the capacitor lower electrode, and a capacitor upper electrode formed on the capacitor insulating film. The capacitor lower electrode is formed of a platinum group material and the capacitor insulating film is formed of a high-dielectric-constant material.

27 Claims, 29 Drawing Sheets

SEMICONDUCTOR DEVICE HAVING RIGID CAPACITOR STRUCTURE WITH A LINER FILM

CROSS-REFERENCE TO RELATED APPLICATIONS

This application is based upon and claims the benefit of priority from the prior Japanese Patent Applications No. 2000-197795, filed Jun. 30, 2000, and No. 2001-175616, filed Jun. 11, 2001, the entire contents of both of which are incorporated herein by reference.

BACKGROUND OF THE INVENTION

This invention relates to a semiconductor device having a rigid capacitor structure and a method for fabricating the same and more particularly to the structure of cell capacitors and fuse capacitors of a semiconductor memory device.

The development of the fine patterning technique of recent semiconductor devices is significant. Particularly, the fine patterning technique for DRAMs (Dynamic Random Access Memories) is increasingly developed. Therefore, the following subjects become important.

(1) How to form capacitors having sufficiently large capacitances in a limited area which becomes smaller as the area occupied by the memory cells becomes smaller.

(2) How to maintain the manufacturing yield to the same degree as the former generation with the progress of generations of integration.

The subject (1) can be coped with by using a cylinder structure for a cell capacitor, for example. The cylinder structure is one type of stacked capacitor and attains a large surface area while suppressing the occupied area by 3-dimensionally forming a cylindrical capacitor.

Further, as the technique for solving the subject (2), much attention is paid to the redundancy technique. The technique is attained by previously forming fuse elements in the semiconductor device in order to compensate for semiconductor elements which become partly defective. If the semiconductor element becomes defective, a fuse element corresponding to the defective portion is cut off to replace the defective semiconductor element by a spare semiconductor element, thus enhancing the manufacturing yield as a whole chip.

As the fuse elements, laser fuses in which information corresponding to the defective portion is written by fusing (laser-blowing) a metal interconnection layer by application of laser have been widely used. However, in recent years, electrical fuses for electrically cutting off or short-circuiting fuse elements have received much attention. As one type of the electrical fuse, an anti-fuse using the capacitor structure is provided. In the anti-fuse, information is written by applying high voltage to the fuse structure (fuse capacitor) to break down the insulating film and electrically short-circuiting the fuse capacitor. In the DRAM, the anti-fuse starts to be used in the redundancy technique for replacing the defective memory cell by a redundancy memory cell. Generally, the anti-fuse is formed by the same process as that for forming the cell capacitor structure.

The conventional DRAM structure is explained with reference to FIG. 1. FIG. 1 is a partial cross sectional view showing a DRAM using double-surface-cylinder type stacked capacitors.

As shown in FIG. 1, element isolation regions 11 are formed in a memory cell array area A1 and peripheral area A2 in a silicon substrate 10 and a gate insulating film 12 is formed on the silicon substrate 10. The "memory cell array area" indicates an area in which memory cells of a DRAM are formed and the "peripheral area" indicates an area in which anti-fuses are formed. Gate electrodes 13 are formed on the gate insulating film 12 and MOS transistors are formed by selectively forming impurity diffused layers (not shown) functioning as a drain region and source regions in the silicon substrate 10. The MOS transistors are used as cell transistors in the memory cell array area A1. Further, an interlayer insulating film 15 for covering the MOS transistors and a silicon oxide ($SiO_2$) film 16 are sequentially formed on the gate insulating film 12. Bit lines 17 connected to corresponding drain regions of the cell transistors in areas (not shown) are formed in the interlayer insulating film 15 of the memory cell array area A1 and interconnection layers 17 connected to corresponding drain regions of the MOS transistors are formed in the peripheral area A2. Further, contact plugs 18 connected to the source regions of the cell transistors in the memory cell array area A1 and the MOS transistors in the peripheral id area A2 are formed in the interlayer insulating film 15 and silicon oxide film 16. Then, double-surface-cylinder type capacitor lower electrodes 20 are formed on the silicon oxide film 16 so as to be connected to corresponding contact plugs 18. An interlayer insulating film 22 is formed in an area on the silicon oxide film 16 in which no capacitor lower electrode 20 is formed. Capacitor insulating films 24 are respectively formed on the capacitor lower electrodes 20. Capacitor upper electrodes 25 are formed on the capacitor insulating films 24 to respectively form cell capacitors and fuse capacitors in the memory cell array area A1 and peripheral area A2. Further, an interlayer insulating film 27 is formed on the capacitors and a metal interconnection layer 29 is formed on the interlayer insulating film 27 to form a DRAM.

FIG. 2A is a plane pattern of the capacitors of the above DRAM. In this example, a case wherein the DRAM is a 256-Mbit DRAM designed according to the 0.13 $\mu$m rule is shown.

As shown in FIG. 2A, cell capacitors 61 formed on an interlayer insulating film 60 are arranged at an interval of approx. 0.52 $\mu$m in the bit line direction and at an interval of approx. 0.26 $\mu$m in the word line direction. On the other hand, fuse capacitors 62 are arranged at an interval of approx. 1 $\mu$m and are generally arranged at an interval larger than at least twice the interval of the cell capacitors 61. Thus, the cell capacitors in the memory cell array area A1 are arranged in a large-scale array form and the fuse capacitors in the peripheral area A2 are arranged in a small scale configuration of single bit to several bits in many cases. This is because the plate electrodes (upper electrodes) of the cell capacitors 61 are commonly connected, but all of the plate electrodes of the fuse capacitors 62 must be independently connected. Further, this is because high voltage for breaking down the fuse capacitors is applied to interconnections connected to the plate electrodes of the fuse capacitors, and therefore, it becomes necessary to use metal interconnections with large width.

With the above double-surface-cylinder type capacitor, since the bottom surface, inner peripheral surface and outer peripheral surface of the cylinder can be used as an electrode surface, the capacitance of the capacitor can be made large.

As a material of the capacitor insulating film of the conventional cell capacitor and fuse capacitor, a silicon oxide film is used. Further, a polysilicon film is used as a material of the capacitor electrode and an HSG (Hemi-Spherical Grained) silicon film is used to attain a larger surface area.

In recent years, attempts have been made to increase the capacitance of the capacitor by using a high-dielectric-constant material, for example, a tantalum oxide ($Ta_2O_5$) film having a larger dielectric constant in comparison with the silicon oxide film to form the capacitor insulating film. It is known that an element such as ruthenium in the platinum group is preferably used as a material of the capacitor electrode if the high-dielectric-constant material is used to form the capacitor insulating film.

However, elements belonging to the platinum group have poor adhesion with respect to a silicon oxide film generally used as an interlayer insulating film. Therefore, it is difficult to deposit and form a capacitor lower electrode by use of the platinum group element. Further, since the capacitor lower electrode is stripped from the peripheral interlayer insulating film after forming the capacitor lower electrode, the structure becomes fragile and the cylinder falls in some cases. In addition, a contact portion between the contact plug and the capacitor lower electrode tends to be cut off or partly damaged to have high resistance.

As explained with reference to FIG. 2A, the fuse capacitors are arranged at the larger interval in comparison with the cell capacitors. That is, the design rules of the capacitors in the memory cell array area and peripheral area are greatly different from each other. For example, when a trench portion used for forming a capacitor is formed in the interlayer insulating film, the lithography condition is set to match with the condition in the memory cell array area in which the design rule is strict. Then, the capacitor forming process in the peripheral area cannot be optimally set. Specifically, the diameter of the trench portion in the peripheral area becomes smaller than the designed one, for example, and the size control becomes difficult. If the diameter of the trench portion used for forming an anti-fuse becomes smaller, an amount of material gas introduced into the trench portion when the capacitor lower electrode is formed by use of a CVD (Chemical vapor Deposition) method is reduced. Then, the film thickness of the capacitor lower electrode becomes smaller, and as a result, the capacitor lower electrode 20 tends to fall as shown in FIG. 2B. Further, since the film thickness of the capacitor lower electrode 20 becomes smaller particularly in the bottom portion, a pin hole or the like is formed in the lower electrode 20. Then, the contact plug 18 is also etched in the later wet etching step in some cases. If the above defect occurs, the anti-fuse cannot be practically used and dust is caused on the wafer, thereby causing the manufacturing yield to be significantly lowered.

BRIEF SUMMARY OF THE INVENTION

A semiconductor device according to an aspect of the present invention comprises a contact plug formed in a first interlayer insulating film on a semiconductor substrate; a second interlayer insulating film formed on the first interlayer insulating film and having an opening reaching the first interlayer insulating film, said contact plug being exposed to the bottom surface of the opening; a liner film formed on bottom and side surfaces of the opening; a stacked capacitor lower electrode formed to be at least partly filled in the opening, said capacitor lower electrode being formed in contact with said first and second interlayer insulating films with said liner film disposed therebetween and said capacitor lower electrode being formed of a platinum group material; a capacitor insulating film formed on the capacitor lower electrode, said capacitor insulating film being formed of a high-dielectric-constant material; and a capacitor upper electrode formed on said capacitor insulating film; and wherein a portion of said liner film which is formed on the side surface of the opening formed in said second insulating film is recessed by a depth equal to the film thickness of said capacitor insulating film from the opening end face of the opening and a recessed portion is filled with said capacitor insulating films.

A method for fabricating a semiconductor device according to an aspect of the present invention comprises the steps of forming a first interlayer insulating film on a semiconductor substrate; forming a contact plug in the first interlayer insulating film; forming a second interlayer insulating film on the first interlayer insulating film; forming a trench portion having a depth to reach the first interlayer insulating film in the second interlayer insulating film, the contact plug being exposed to the bottom surface of the trench portion; forming a liner film on the bottom and side surfaces of the trench portion; forming a capacitor lower electrode on the liner film, recessing the liner film disposed between the second interlayer insulating film and the capacitor lower electrode from the upper surface of the second interlayer insulating film; forming a capacitor insulating film on the capacitor lower electrode, the capacitor insulating film being formed to fill an area of the liner film recessed from the upper surface of the second interlayer insulating film; and forming a capacitor upper electrode on the capacitor insulating film; wherein the step of recessing the liner film is to recess the liner film from the upper surface of the second interlayer insulating film by at least a depth equal to the film thickness of the capacitor insulating film.

DETAILED DESCRIPTION OF THE INVENTION

Figure 3:
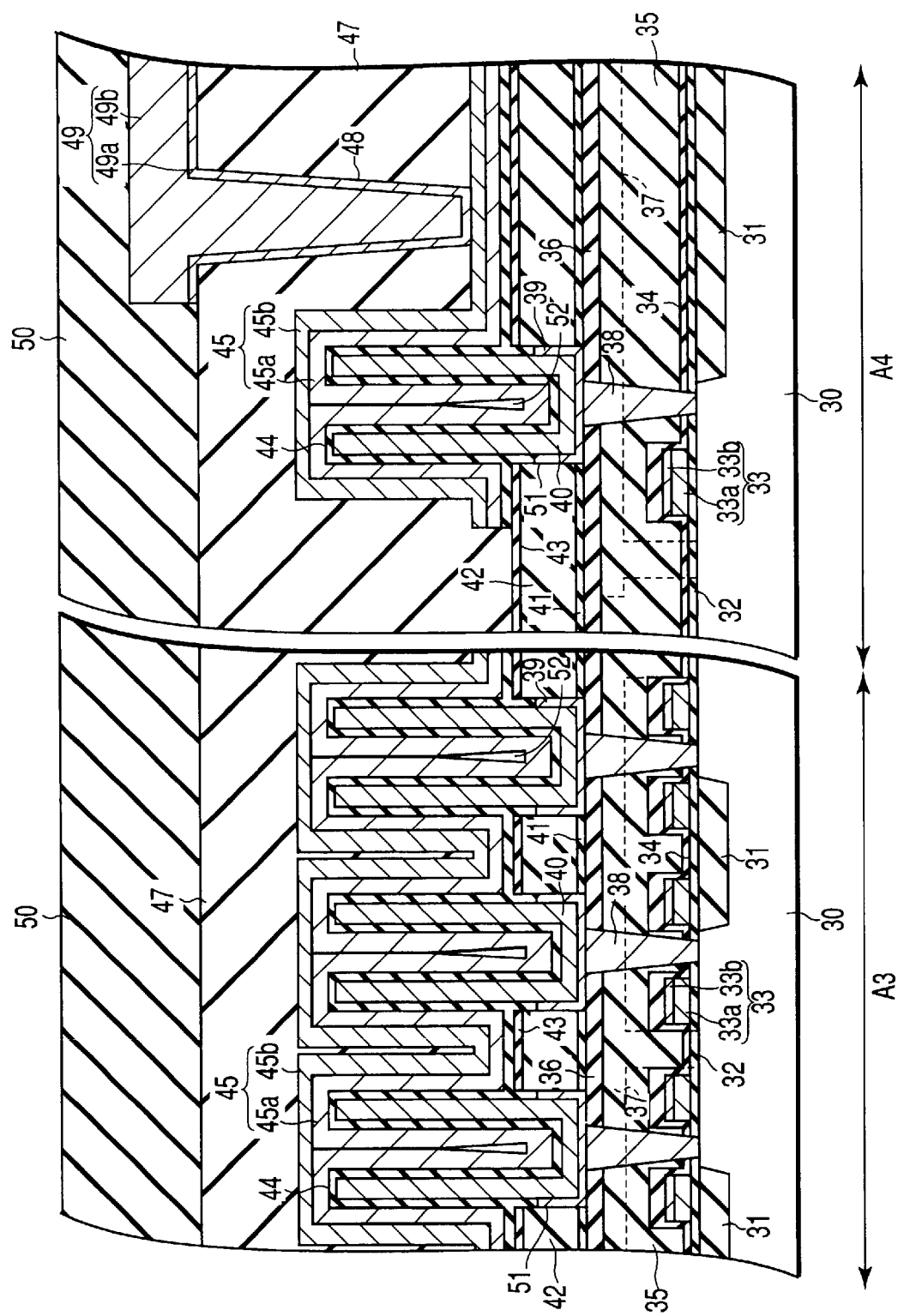
FIG. 3 is a cross sectional view showing a DRAM according to a first embodiment of this invention.

FIG. 3 is a cross sectional view showing a semiconductor device according to a first embodiment of this invention and is a cross sectional view of a DRAM in which double-surface-cylinder type capacitor structures are used as cell capacitors and fuse capacitors.

As shown in FIG. 3, element isolation regions 31 are formed in a memory cell array area A3 and peripheral area A4 in a silicon substrate 30 and a gate insulating film 32 is formed on the silicon substrate 30. The "memory cell array area" indicates an area in which memory cells of the DRAM are formed and the "peripheral area" indicates an area in which anti-fuses are formed. Gate electrodes 33 are formed on the gate insulating film 32. The gate electrode 33 has a two-layered structure including a polysilicon (polycrystalline silicon) film 33a and tungsten (W) film 33b, for example. MOS transistors are formed by selectively forming impurity diffused layers (not shown) used as source and drain regions in the silicon substrate 30. The MOS transistors in the memory cell array area A1 are used as cell transistors.

Further, a silicon nitride (SiN) film 34 is formed on the silicon substrate 30 to cover the MOS transistors. An interlayer insulating film 35 and silicon oxide ($SiO_2$) film 36 are sequentially formed on the silicon nitride film 34. Bit lines 37 connected to corresponding drain regions of the cell transistors in areas (not shown) are formed in the interlayer insulating film 35 of the memory cell array area A3 and interconnection layers 37 connected to corresponding drain regions of the MOS transistors are formed in the peripheral area A4. Further, contact plugs 38 connected to the source regions of the MOS transistors in the memory cell array area A3 and peripheral area A4 are formed in the silicon nitride film 34, interlayer insulating film 35 and silicon oxide film 36.

An interlayer insulating film formed of a silicon nitride (SiN) film 41, silicon oxide ($SiO_2$) film 42 and silicon nitride (SiN) film 43 is formed on the silicon oxide film 36. Cylindrical trenches 51 reaching the silicon oxide film 36 are formed in the interlayer insulating film. The contact plugs 38 are exposed to the bottom portions of the trenches 51. The trenches 51 are formed for the respective contact plugs 38 and a liner film 39 is formed on the bottom and side surfaces of each trench 51. The liner film 39 formed on the side surface of the trench 51 is recessed so as not to reach the upper surface of the silicon nitride film 43 and titanium nitride (TiN) is used as an material thereof, for example.

Then, double-surface-cylinder type capacitor lower electrodes 40 having a cylindrical shape are formed in the respective trenches 51 with a portion of each lower electrode-from the bottom surface to a preset height filled in the trench 51. The capacitor lower electrode 40 is electrically connected to a corresponding contact plug 38 via the liner film 39. The degree of adherence between the capacitor lower electrode 40 and the silicon oxide films 36, 42 and silicon nitride films 41, 43 is enhanced by the presence of the liner film 39. Further, capacitor insulating films 44 are respectively formed on the capacitor lower electrodes 40 and capacitor upper electrodes 45 are respectively formed on the capacitor insulating films 44 to form double-surface-cylinder type stacked capacitors. For example, the capacitor upper electrode 45 has a two-layered structure including a ruthenium (Ru) film 45a and titanium nitride (TiN) film 45b.

Further, an interlayer insulating film 47 is formed on the capacitors. A contact hole 48 reaching the capacitor upper electrode 45 is formed in the interlayer insulating film 47 and a metal interconnection layer 49 filling the contact hole 48 is formed on the interlayer insulating film 47. The metal interconnection layer 49 has a two-layered structure including a barrier metal layer 49a and metal layer 49b, for example. Further, an interlayer insulating film 50 is formed on the interlayer insulating film 47 to form a DRAM.

As described above, according to the DRAM of the present embodiment, for example, a titanium nitride film is formed as the liner film 39 in a portion in which the capacitor lower electrode 40 and silicon oxide film are made in contact with each other. The titanium nitride film has the effect of adhering the platinum group material to the silicon oxide film. Therefore, even if a high-dielectric-constant film is used as the capacitor insulating film in order to increase the capacitance of the capacitor and a platinum group material is used to form the capacitor, lower electrode, the degree of adherence between the capacitor lower electrode and the surrounding interlayer insulating, film can be enhanced. As a result, the capacitor structure can be made rigid while the capacitance of the capacitor is increased.

Next, a method for fabricating the DRAM with the above structure is explained with reference to FIGS. 4A to 4G. FIGS. 4A to 4G are cross sectional views showing the manufacturing process of the DRAM.

Figure 4A:
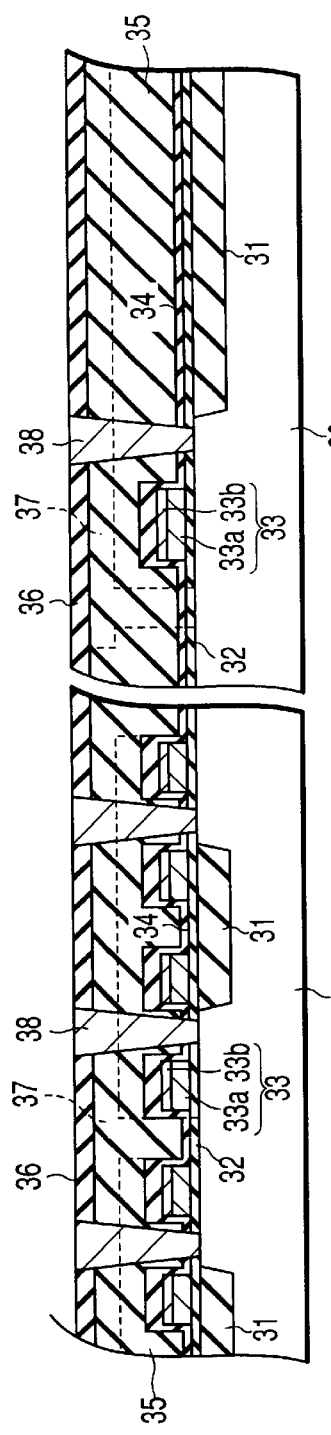
FIGS. 4A to 4G are cross sectional views showing the manufacturing process of the DRAM according to the first embodiment of this invention.

First, as shown in FIG. 4A, element isolation regions 31 are formed in a memory cell array area A3 and peripheral area A4 in a silicon substrate 30 by use of the STI (Shallow Trench Isolation) technique. Then, MOS transistors are formed in the memory cell array area A1 and peripheral area A4 by the known technique. That is, a silicon oxide ($SiO_2$) film is formed as a gate insulating film 32 on the silicon substrate 30 by the thermal oxidation method, for example. Next, a polysilicon (polycrystalline silicon) film 33a and tungsten film 33b are sequentially deposited on the gate insulating film 32. Then, gate electrodes 33 are formed by patterning the polysilicon film 33a and tungsten (W) film 33b. After this, impurity is selectively doped into the silicon substrate 30 by the ion-implantation technique to form impurity diffused layers (not shown) used as source and drain regions. The MOS transistors formed in the memory cell array area A3 are used as cell transistors. Further, a silicon nitride (SiN) film 34 is formed on the silicon substrate 30 by the CVD method, for example, to cover the gate electrodes 33 and then an interlayer insulating film 35 is formed on the silicon nitride film 34. As a material of the interlayer insulating film 35, a silicon oxide ($SiO_2$) film formed of TEOS (Tetraethylorthosilicate: $Si(OC_2H_5)_4$) or BPSG (Boron Phosphorous Silicate Glass) film which is excellent in step coverage is used. Then, metal interconnection layers 37 are formed in the interlayer insulating film 35. The metal interconnection layers 37 are connected to corresponding drain regions of the cell transistors and the MOS transistors in the peripheral area A4 in areas (not shown) and function as bit lines in the memory cell area A3. Further, a silicon oxide film ($SiO_2$) 36 is formed on the interlayer insulating film 35. After this, contact plugs 38 for making contact with the source regions of the cell transistors and the MOS transistors in the peripheral area A4 are formed in the interlayer insulating film 35 and silicon oxide film 36.

Figure 4B:
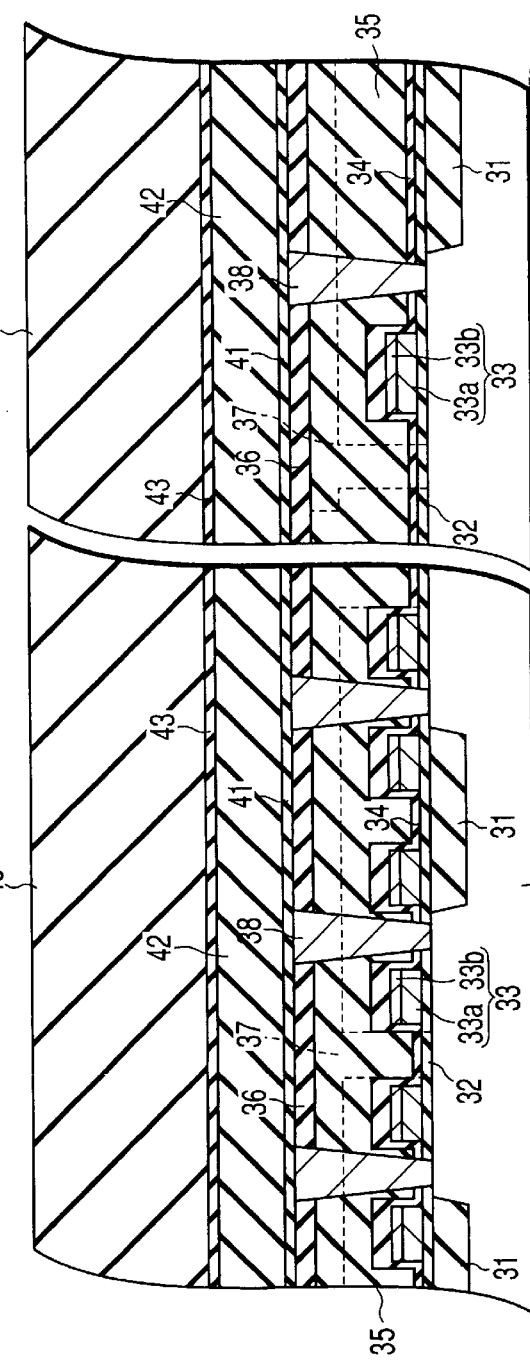

Next, as shown in FIG. 4B, a silicon nitride (SiN) film 41, silicon oxide (SiO$_2$) film 42, silicon nitride (SiN) film 43 and silicon oxide (SiO$_2$) film 46 are sequentially formed as an interlayer insulating film on the silicon oxide film 36 by the CVD method or the like.

Figure 4C:
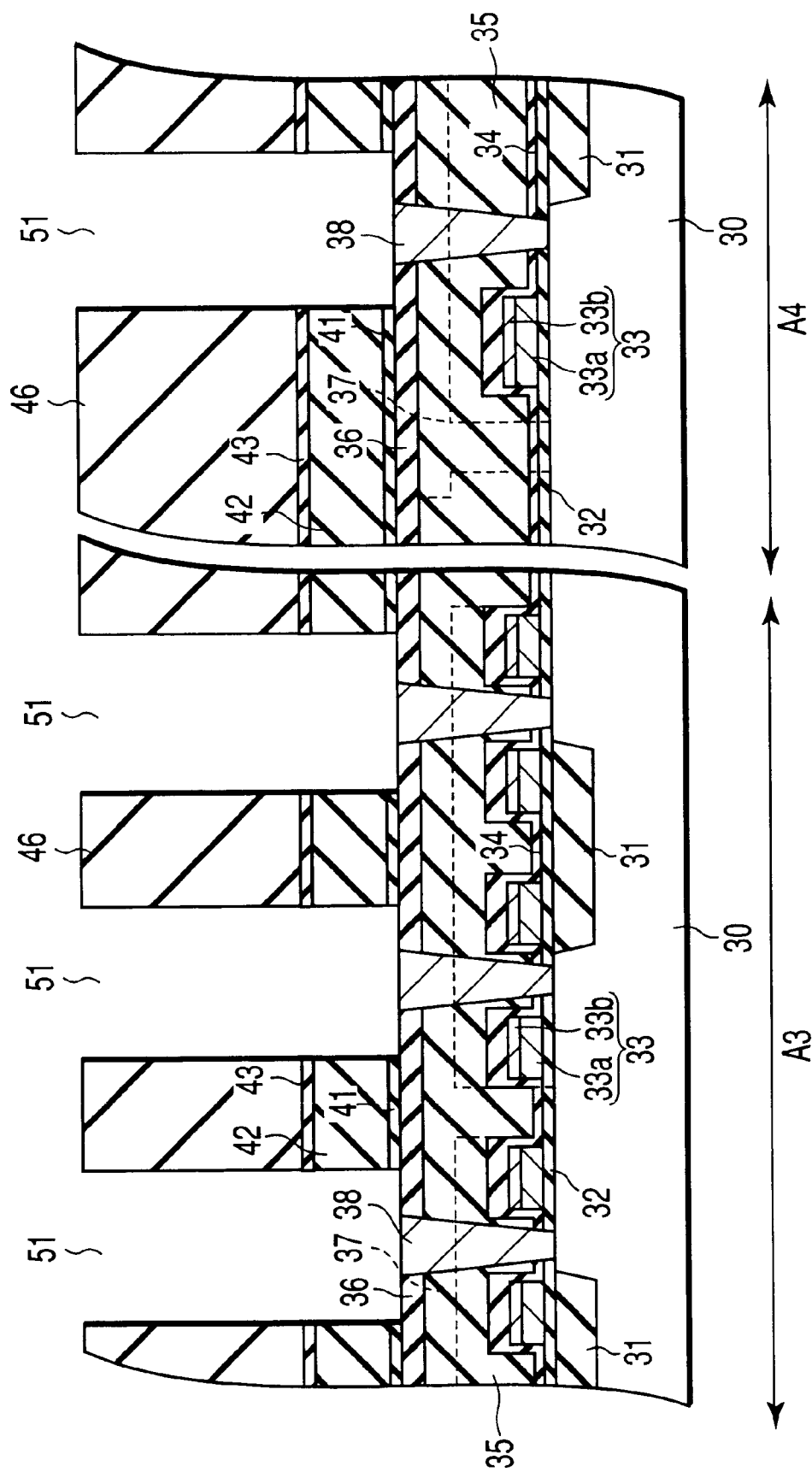

Then, as shown in FIG. 4C, trench portions 51 are formed by etching the silicon nitride films 41, 43 and silicon oxide films 42, 46 in capacitor forming areas of the memory cell array area A3 and peripheral area A4 by use of the lithography technology and anisotropic etching technique such as the RIE (Reactive Ion Etching) method. In this case, the etching process is effected so as to expose the upper surfaces of the contact plugs 38 to the bottom portions of the trench portions 51.

Figure 4D:
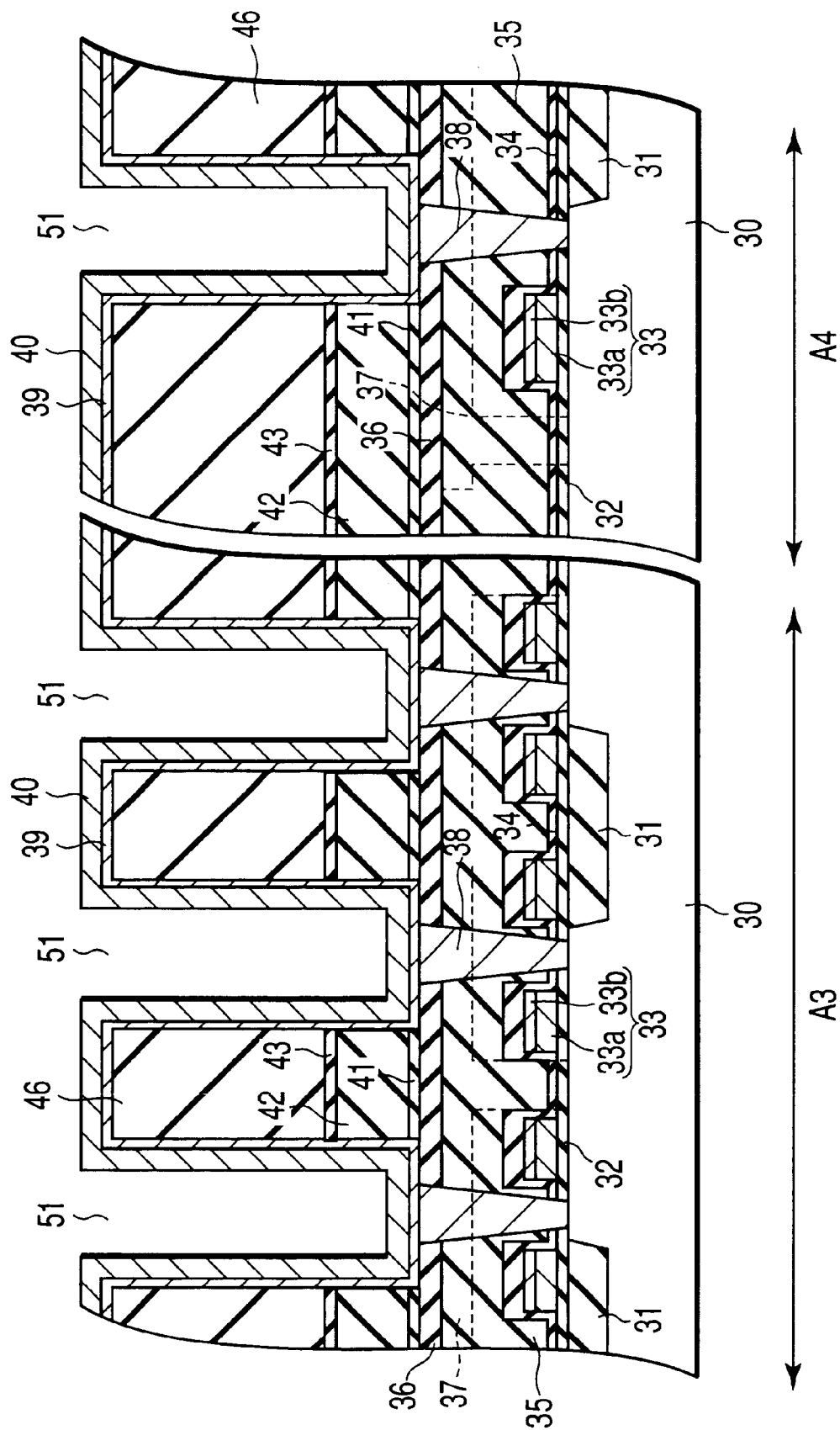

Next, as shown in FIG. 4D, a liner film 39 formed of titanium nitride (TiN), for example, is formed on the silicon oxide films 46 and the inner surfaces of the trench portions 51 by the CVD method or the like. Then, capacitor lower electrodes 40 are formed on the liner film 39 by the CVD method or the like. As a material of the capacitor lower electrode 40, a conductive film of ruthenium (Ru) in the platinum group, for example, is used. Further, the capacitor lower electrode 40 is used as a storage node electrode of the cell capacitor in the memory cell array area A3.

Figure 4E:
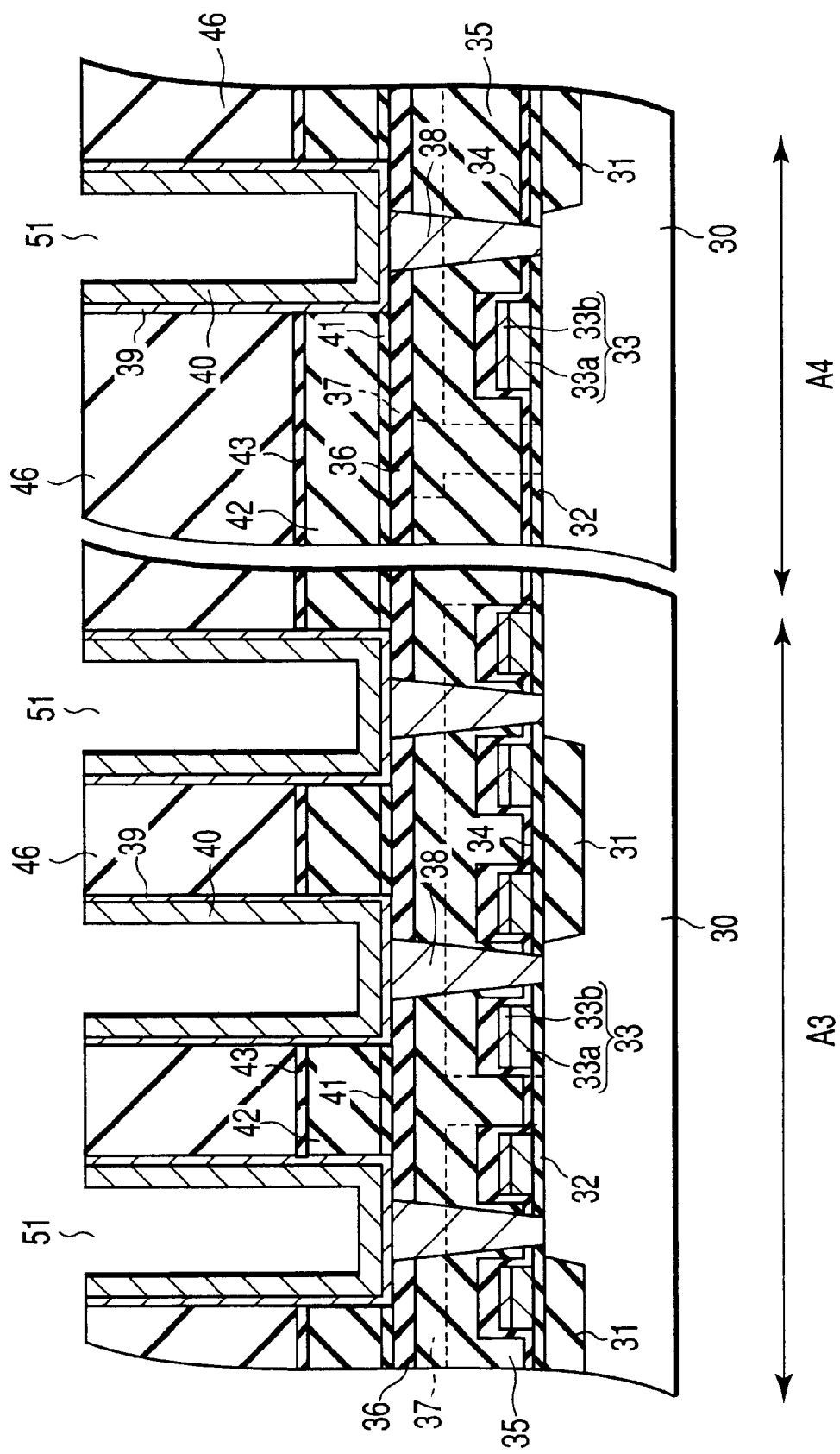

Next, as shown in FIG. 4E, the liner film 39 and capacitor lower electrodes 40 lying on the upper surfaces of the silicon oxide films 46 are polished and removed by use of the CMP (Chemical Mechanical Polishing) method or the like. In this case, it is preferable to fill resist materials in the trench portions 51 so as to protect the capacitor lower electrodes 40. After the polishing process by the CMP method, the resist is removed by ashing or the like.

After this, the silicon oxide films 46 are removed by the wet etching method or the like. Then, part of the liner film 39 is removed by, for example, the wet etching method using a mixture of sulfuric acid (H$_2$SO$_4$) and hydrogen peroxide (H$_2$O$_2$) solution to form a structure shown in FIG. 4F. That is, in the present step, double-surface-cylinder type cell capacitor lower electrodes which are separated for each bit are completed in the memory cell array area A3. Further, double-surface-cylinder type fuse capacitor lower electrodes 40 are completed in the peripheral area A4. When the liner film 39 is etched, the etching process is effected to recess the liner film 39 so that the upper surface of the liner film 39 will become lower than at least the upper surface of the silicon nitride film 43.

Figure 4F:
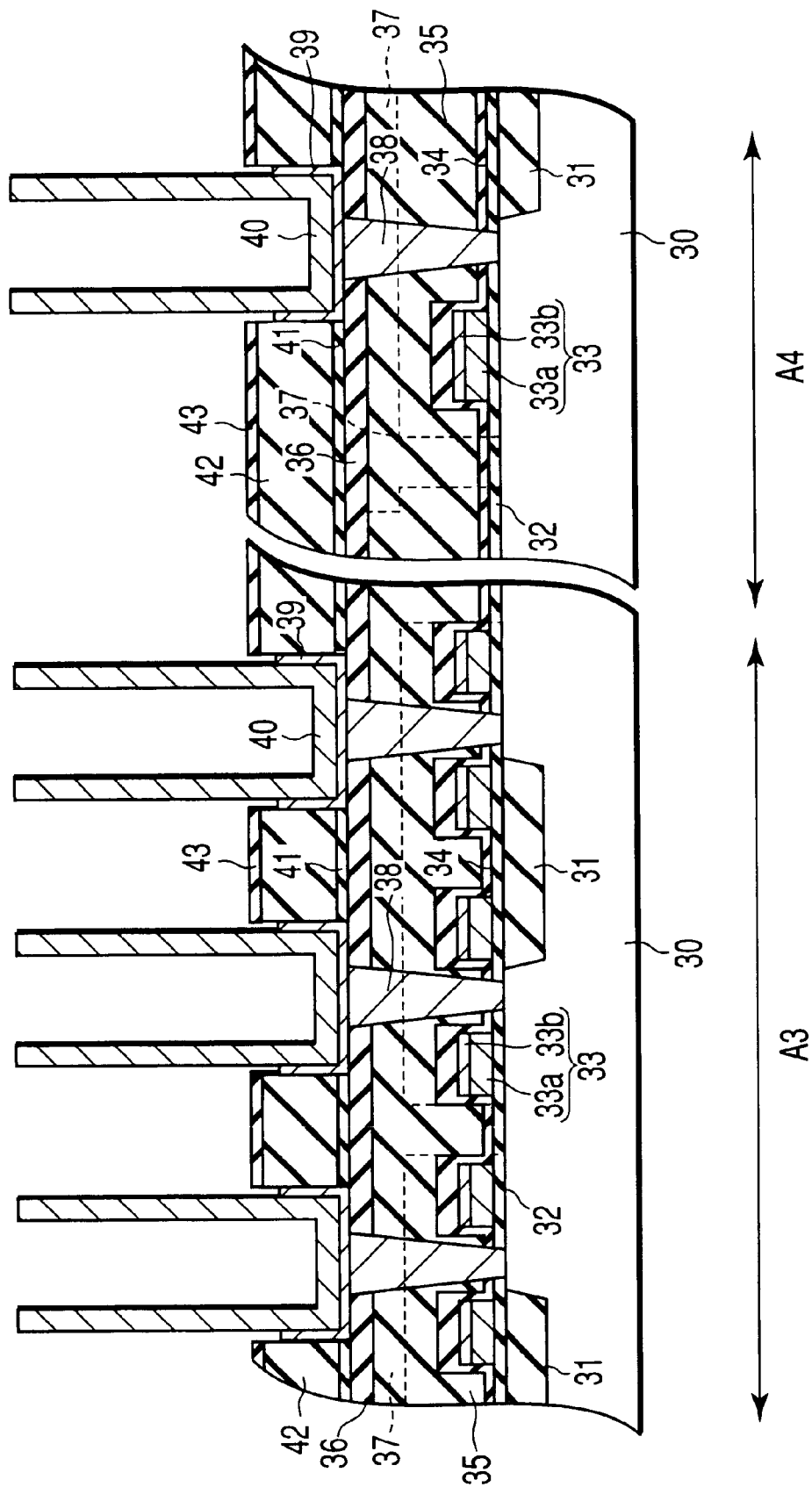
Figure 4G:
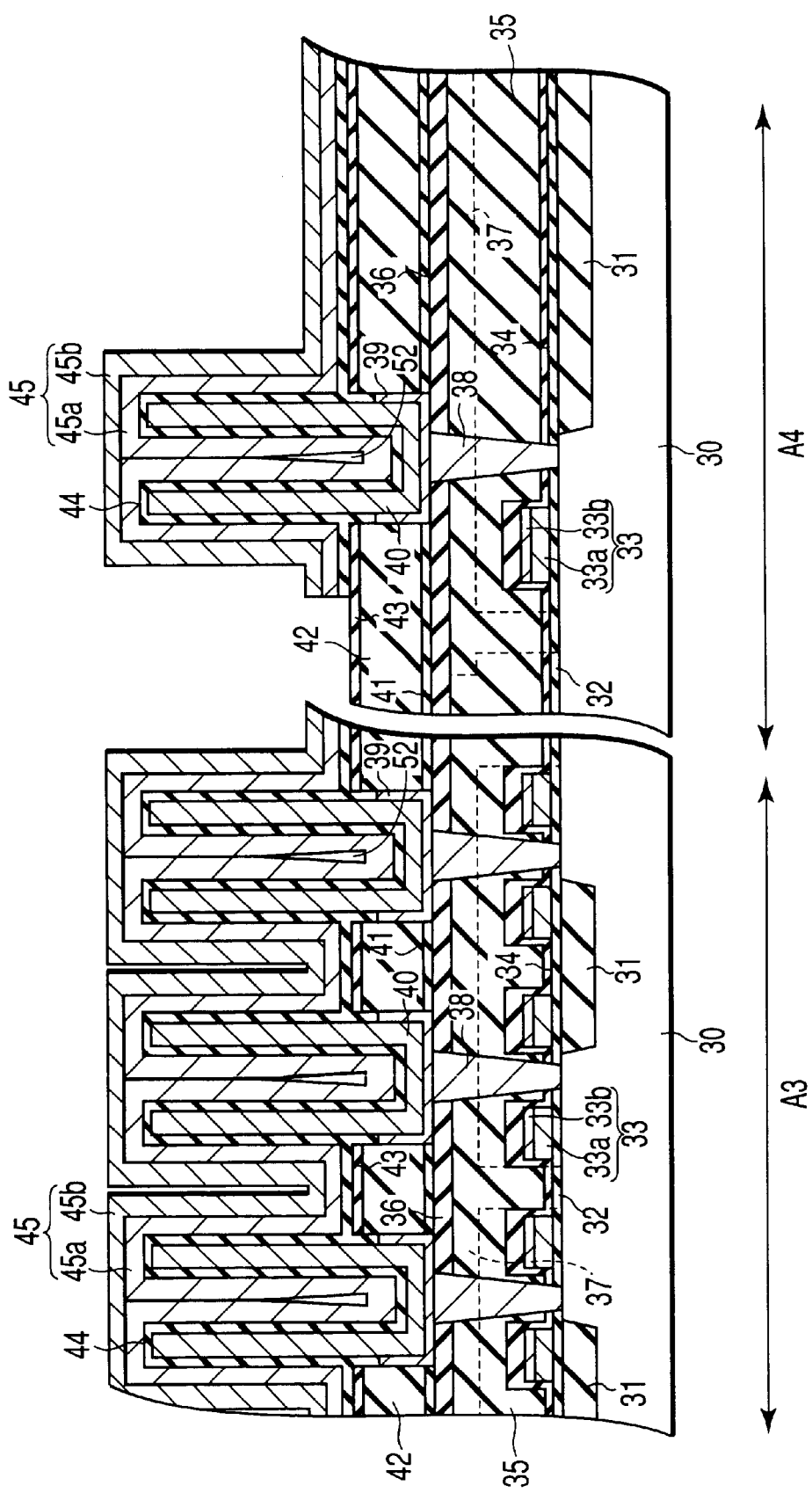

Next, as shown in FIG. 4G, a capacitor insulating film 44 is formed on the capacitor lower electrodes 40 and silicon nitride films 43 by the CVD method or the like. In this case, the capacitor insulating film 44 is formed to fill portions of the liner film 39 which are recessed from the upper surface of the silicon nitride film 43. Further, in order to securely obtain a sufficiently large capacitance of the capacitor, a high-dielectric-constant film, for example, a tantalum oxide (Ta$_2$O$_5$) film having a larger dielectric constant than the silicon oxide (SiO$_2$) film is used as a material of the capacitor insulating film 44. Then, a capacitor upper electrode 45 having a laminated structure of a ruthenium (Ru) film 45$a$ and titanium nitride (TiN) film 45$b$ is formed on the capacitor insulating film 44 by the CVD method or the like. After this, the capacitor insulating film 44 and capacitor upper electrode 45 are patterned into a desired pattern by use of the lithography technology and etching process to complete double-surface-cylinder type cell capacitors and fuse capacitors in the memory cell array area A3 and peripheral area A4.

The capacitor upper electrode 45 is generally formed by the CVD method. At the time of film formation by the CVD method, material gas does not smoothly flow in the cylinder. Particularly, in the case of a 256-Mbit DRAM formed according to the 0.13 μm rule, the aspect ratio of the cylinder will become 4 or more. Then, the material gas cannot sufficiently reach the bottom portion of the cylinder and the film forming speed in the bottom portion becomes lower than that in the upper portion of the cylinder. Therefore, the internal portion of the cylinder cannot be completely filled with the capacitor upper electrode 45 as shown in the drawing and a cavity 52 may be formed in the cylinder bottom portion in some cases. However, the cavity 52 has a function of alleviating stresses applied to the respective layers constructing the DRAM and it may safely be said that the presence of the cavity 52 is desirable.

After this, a silicon oxide (SiO$_2$) film formed by use of TEOS and an interlayer insulating film 47 formed of a BPSG film are formed by deposition on the capacitor upper electrodes 45 and silicon nitride films 43. Then, a contact hole 48 reaching the capacitor upper electrode 45 is formed in the interlayer insulating film 47. Next, a barrier metal layer 49$a$ and metal layer 49$b$ are filled into the contact hole 48 to form a metal interconnection layer 49 which is connected to the capacitor upper electrode 45. Further, an interlayer insulating film 50 for covering the metal interconnection layer 49 is formed by deposition on the interlayer insulating film 47 to complete a DRAM.

Figure 5A:
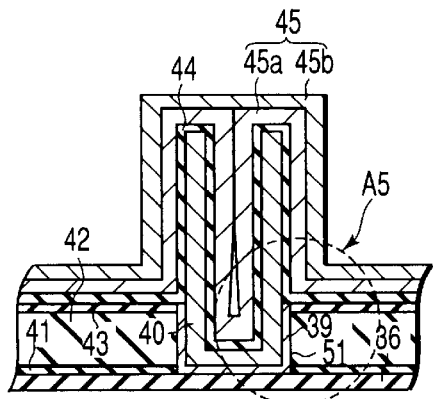
FIG. 5A is a cross sectional view of the capacitor structure provided in the DRAM according to the first embodiment of this invention.

The effect attained in the above capacitor fabricating method is explained with reference to FIGS. 5A to 5F. FIGS. 5A, 5C and 5E are cross sectional views of the capacitor and FIGS. 5B, 5D and 5F are enlarged views respectively showing portions A5, A6, A7 in FIGS. 5A, 5C, 5E.

Originally, each of the cell capacitors and fuse capacitors is formed of the capacitor lower electrode 40, capacitor insulating film 44 and capacitor upper electrode 45. However, the liner film 39 is disposed between the interlayer insulating films 41, 42, 43 and the capacitor lower electrode 40. Therefore, a parasitic capacitor structure formed of the liner film 39, capacitor insulating film 44 and capacitor upper electrode 45 is formed on the opening side of the trench portion 51 formed in the interlayer insulating films 41, 42, 43. Since the liner film 39 is formed of a material different from the capacitor lower electrode 40, the parasitic capacitor structure has a characteristic different from that of the cell capacitor and fuse capacitor. Therefore, there occurs a possibility that the parasitic capacitor structure gives an unexpected bad influence on the cell capacitor and fuse capacitor.

Figure 5B:
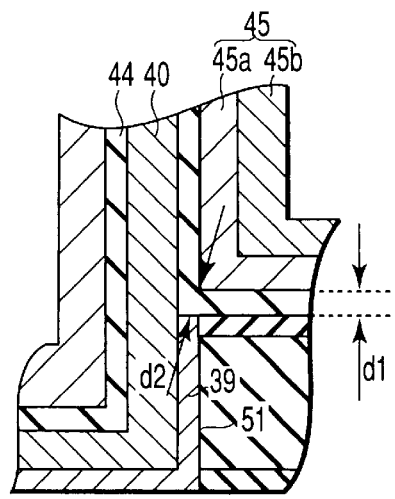
FIG. 5B is an enlarged view of part of FIG. 5A.
Figure 5C:
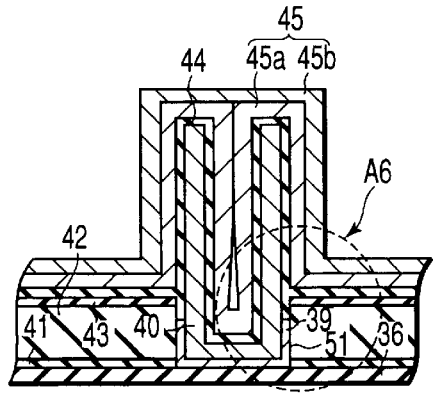
FIG. 5C is a cross sectional view of the capacitor structure provided in the DRAM according to the first embodiment of this invention.
Figure 5D:
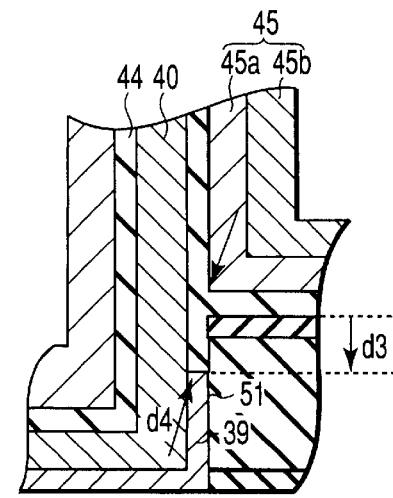
FIG. 5D is an enlarged view of part of FIG. 5C.
Figure 5E:
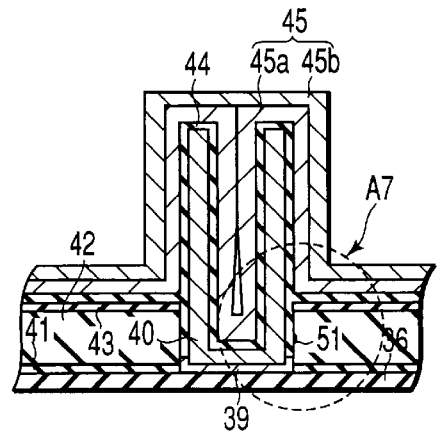
FIG. 5E is a cross sectional view of the capacitor structure provided in the DRAM according to the first embodiment of this invention.
Figure 5F:
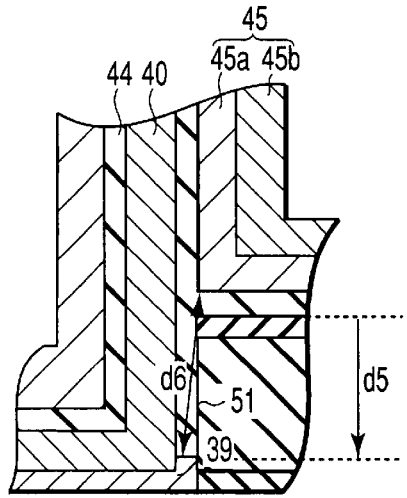
FIG. 5F is an enlarged view of part of FIG. 5E.

The above state is shown in FIGS. 5A and 5B in which the liner film 39 is formed to reach the upper surface of the silicon nitride film 43.

As shown in the drawing, in this case, the electrode-electrode distance d2 of the parasitic capacitor is equal to the electrode-electrode distance d1 (=the film thickness of the capacitor insulating film 44) of the cell capacitor and fuse capacitor. If the electrode-electrode distances are equal, particularly, a leakage current in the parasitic capacitor becomes larger than that of the cell capacitor and fuse capacitor. Therefore, the reliability of the cell capacitor and fuse capacitor cannot be maintained by the influence of the parasitic capacitor.

However, in the present embodiment, as explained in the step shown in FIG. 4F, the liner film 39 is recessed so as not to reach the upper surface of the silicon nitride film 43. The state is shown in FIGS. 5C and 5D.

As shown in FIGS. 5C and 5D, the liner film 39 is recessed from the upper surface of the silicon nitride film 43 by a depth d3, for example. Thus, the electrode-electrode distance d4 of the parasitic capacitor structure becomes larger than the electrode-electrode distance d1 of the cell capacitor and fuse capacitor. As a result, a leak current in the parasitic capacitor can be reduced and the reliability of the cell capacitor and fuse capacitor can be maintained.

If the electrode-electrode distance d4 is not sufficiently large, the liner film 39 is further recessed to increase the electrode-electrode distance d4 of the parasitic capacitor as shown in FIGS. 5E and 5F.

Thus, in the fabricating method according to this embodiment, the influence by the parasitic capacitor can be eliminated by recessing the liner film 39 in the depth direction. Particularly, this brings an extremely great advantage to the DRAM process in which the fine patterning process is developed. This is because it is not practical to control the etching amount in the lateral direction in the cylinder bottom portion whose diameter is made almost equal to the diameter defined according to the design rule and the controllable amount is limited. However, in the present method, since the recess is made in the depth direction, it is easy to control the recessing process and if the film thickness of the interlayer insulating films 41, 42, 43 is increased, the controllable amount can be increased accordingly. In the case of a 256-Mbit DRAM formed according to the 0.13 μm rule, the recessing amount of the liner film 39 set when the capacitor lower electrode is formed of a platinum group material and the capacitor insulating film is formed of a high-dielectric-constant film can be set to at least approximately the film thickness of the capacitor insulting film 44 or preferably twice the film thickness of the capacitor insulating film 44.

As described above, according to the semiconductor device and the fabricating method of the same according to the embodiment of this invention, the capacitor structure which is rigid and excellent in the reliability can be realized.

Figure 6:
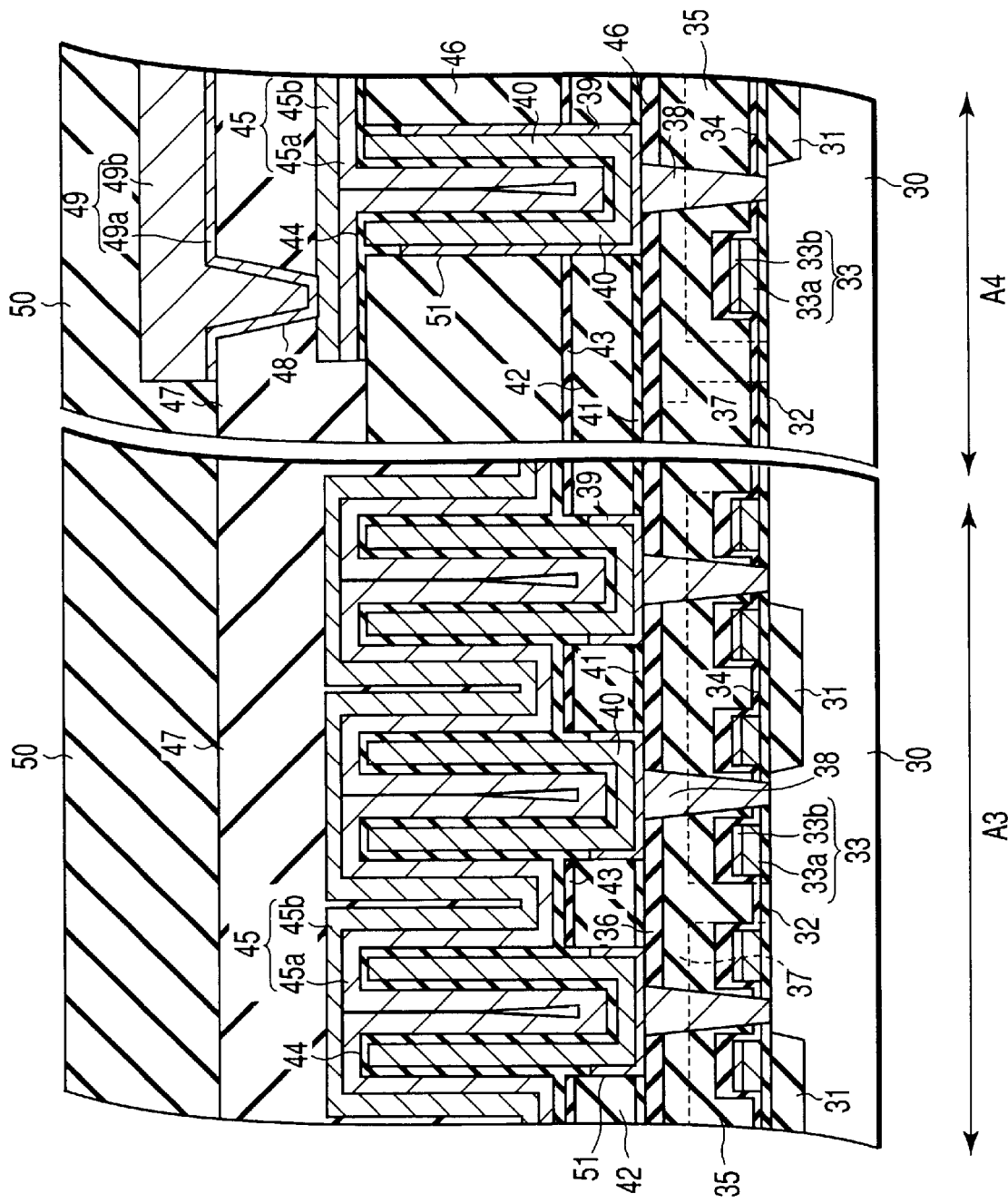
FIG. 6 is a cross sectional view showing a DRAM according to a second embodiment of this invention.

Next, a semiconductor device according to a second embodiment of this invention is explained with reference to FIG. 6. FIG. 6 is a cross sectional view showing a DRAM having double-surface-cylinder type capacitors as cell capacitors and double-surface-concave type capacitor structures as fuse capacitors.

As shown in FIG. 6, double-surface-cylinder type cell capacitors are formed in a memory cell array area A3 on a silicon oxide film 36 and double-surface-concave type fuse capacitors are formed in a peripheral area A4. The structure shown below the silicon oxide film 36 is the same as that in the first embodiment, and therefore, the explanation thereof is omitted.

In the memory cell array area A3, an interlayer insulating film formed of a silicon nitride film 41, silicon oxide film 42 and silicon nitride film 43 is formed on the silicon oxide film 36. In the interlayer insulating film, cylindrical trenches 51 reaching the silicon oxide film 36 are formed. Contact plugs 38 are exposed to the bottom portions of the trenches 51. The trenches 51 are provided for the respective contact plugs 38 and a liner film 39 is formed on the bottom and side surfaces of the trenches 51. The liner film 39 formed on the side surface of the trench 51 is recessed so as not to reach the upper surface of the silicon nitride film 43 and titanium nitride is used as a material thereof, for example.

Double surface cylinder type capacitor lower electrodes 40 having a cylindrical shape are formed in W the respective trenches 51 so that a portion of each lower electrode from the bottom surface to a preset height will be filled in the trench. Each capacitor lower electrode 40 is electrically connected to a corresponding one of the contact plugs 38 via the liner film 39. The degree of adherence between the capacitor lower electrode 40 and the silicon oxide films 36, 42 and silicon nitride films 41, 43 is enhanced by the presence of the liner film 39. Further, capacitor insulating films 44 are respectively formed on the capacitor lower electrodes 40 and capacitor upper electrodes 45 are respectively formed on the capacitor insulating films 44 to form double-surface-cylinder type stacked capacitors. For example, the capacitor upper electrode 45 has a two-layered structure including a ruthenium film 45a and titanium nitride film 45b.

Further, an interlayer insulating film formed of the silicon nitride film 41, silicon oxide film 42 and silicon nitride film 43 is formed on the silicon oxide film 36 in the peripheral area A4. An interlayer insulating film 46 is formed on the silicon nitride film 43. The interlayer insulating film 46 has such film thickness that the upper surface thereof will become substantially in flash with the upper surface of the lower electrode 40 in the memory cell array area A3. Cylindrical trenches 51 reaching the silicon oxide film 36 are formed in an interlayer insulating film formed of the interlayer insulating film 46, silicon nitride films 41, 43 and silicon oxide film 42. Contact plugs 38 are exposed to the bottom portions of the trenches 51. The trenches 51 are provided for the respective contact plugs 38 and a liner film 39 is formed on the bottom and side surfaces of the trenches 51. The liner film 39 formed on the side surface of the trench 51 is recessed so as not to reach the upper surface of the interlayer insulating film 46 and titanium nitride is used as a material thereof, for example.

Cylinder type capacitor lower electrodes 40 having a cylindrical shape are formed in the respective trenches 51. Each capacitor lower electrode 40 is electrically connected to a corresponding one of the contact plugs 38 via the liner film 39. The degree of adherence between the capacitor lower electrode 40 and the interlayer insulating film 46, silicon oxide films 36, 42 and silicon nitride films 41, 43 is enhanced by the presence of the liner film 39. Further, capacitor insulating films 44 are respectively formed on the capacitor lower electrodes 40 and capacitor upper electrodes 45 are respectively formed on the capacitor insulating films 44 to form double-surface-concave type stacked capacitors. For example, the capacitor upper electrode 45 has a two-layered structure including a ruthenium film 45a and titanium nitride film 45b.

Further, an interlayer insulating film 47 is formed on the cell capacitors and fuse capacitors. A contact hole 48 reaching the capacitor upper electrode 45 is formed in the interlayer insulating film 47 and a metal interconnection layer 49 filling the contact hole 48 is formed on the interlayer insulating film 47. The metal interconnection layer 49 has a two-layered structure including a barrier metal layer 49a and metal layer 49b, for example. Further, an interlayer insulating film 50 is formed on the interlayer insulating film 47 to form a DRAM.

As described above, according to the DRAM of the present embodiment, for example, a titanium nitride film is formed as the liner film 39 in a portion in which the capacitor lower electrode 40 is formed in contact with the silicon oxide film. Therefore, the degree of adhesion between the capacitor lower electrode 40 and the interlayer insulating film can be enhanced and thus the same effect as that obtained in the first embodiment can be attained.

Further, the double-surface-cylinder type capacitors are used as the cell capacitors and the double-surface-concave type capacitor structures are used as the fuse capacitors. Therefore, the capacitor lower electrode of the fuse capacitor is so formed as to be supported by the interlayer insulating film and the fuse capacitor can be formed with a rigid structure. Therefore, even if a sufficiently large process margin cannot be attained since the fuse capacitor pattern is formed as substantially an isolated pattern, the fuse capacitor structure is stable and fall of the capacitor can be prevented. As a result, the manufacturing yield of the fuse capacitor can be enhanced while the capacitances of the capacitors in the memory cell array area are maintained and the manufacturing yield and reliability of the DRAM can be enhanced.

Figure 7A:
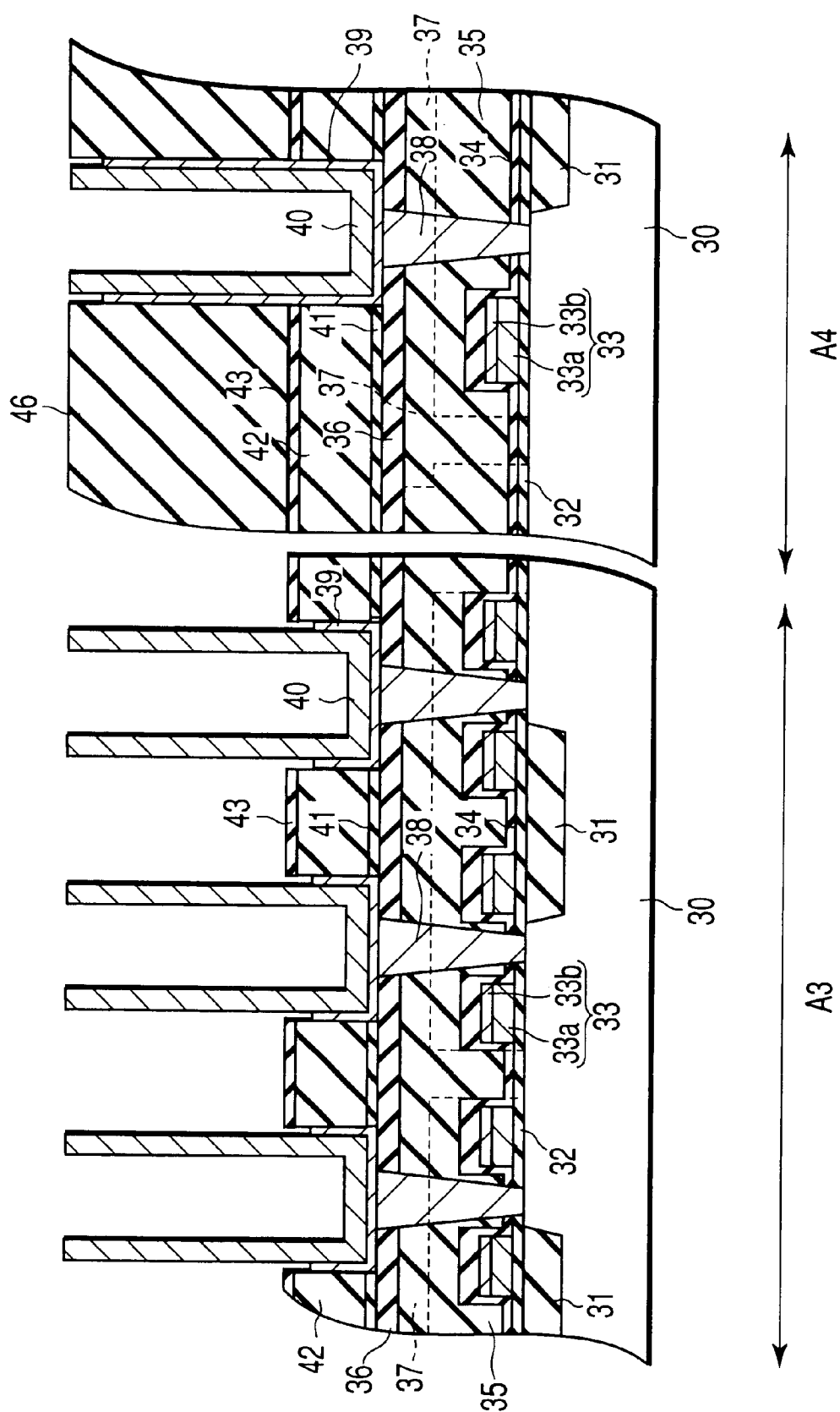
FIGS. 7A and 7B are cross sectional views showing the manufacturing process of the DRAM according to the second embodiment of this invention.

Next, a method for fabricating the DRAM with the above structure is explained with reference to FIGS. 7A and 7B.

First, the structure shown in FIG. 4E is formed by the process explained in the first embodiment.

Then, a resist is coated on an interlayer insulating film 46 and capacitor lower electrodes 40 in a memory cell array area A3 and peripheral area A4. Next, the resist in the memory cell array area A3 is removed by use of the lithography technology. After this, a silicon oxide film 46 in the memory cell array area A3 is removed while the interlayer insulating film 46 in the peripheral area A4 is protected by the resist. Then, the resist remaining in the peripheral area A4 is removed by ashing or the like. After this, part of a line member 39 is removed by, for example, the wet etching method using a mixture of sulfuric acid and hydrogen peroxide solution to form a structure shown in FIG. 7A. That is, the double-surface-cylinder type cell capacitor lower electrodes 40 which are separately formed for each bit in the memory cell array area A3 are completed in the present step. Further, the double-surface-concave type fuse capacitor lower electrodes 40 are completed in the peripheral area A4. When the liner film 39 is etched, the liner film 39 is recessed in the memory cell array area A3 so that the upper surface of the liner film 39 will become lower than at least the upper surface of the silicon nitride film 43 and it is recessed in the peripheral area A4 so that the upper surface of the liner film 39 will become lower than at least the upper surface of the interlayer insulating film 46.

Figure 7B:
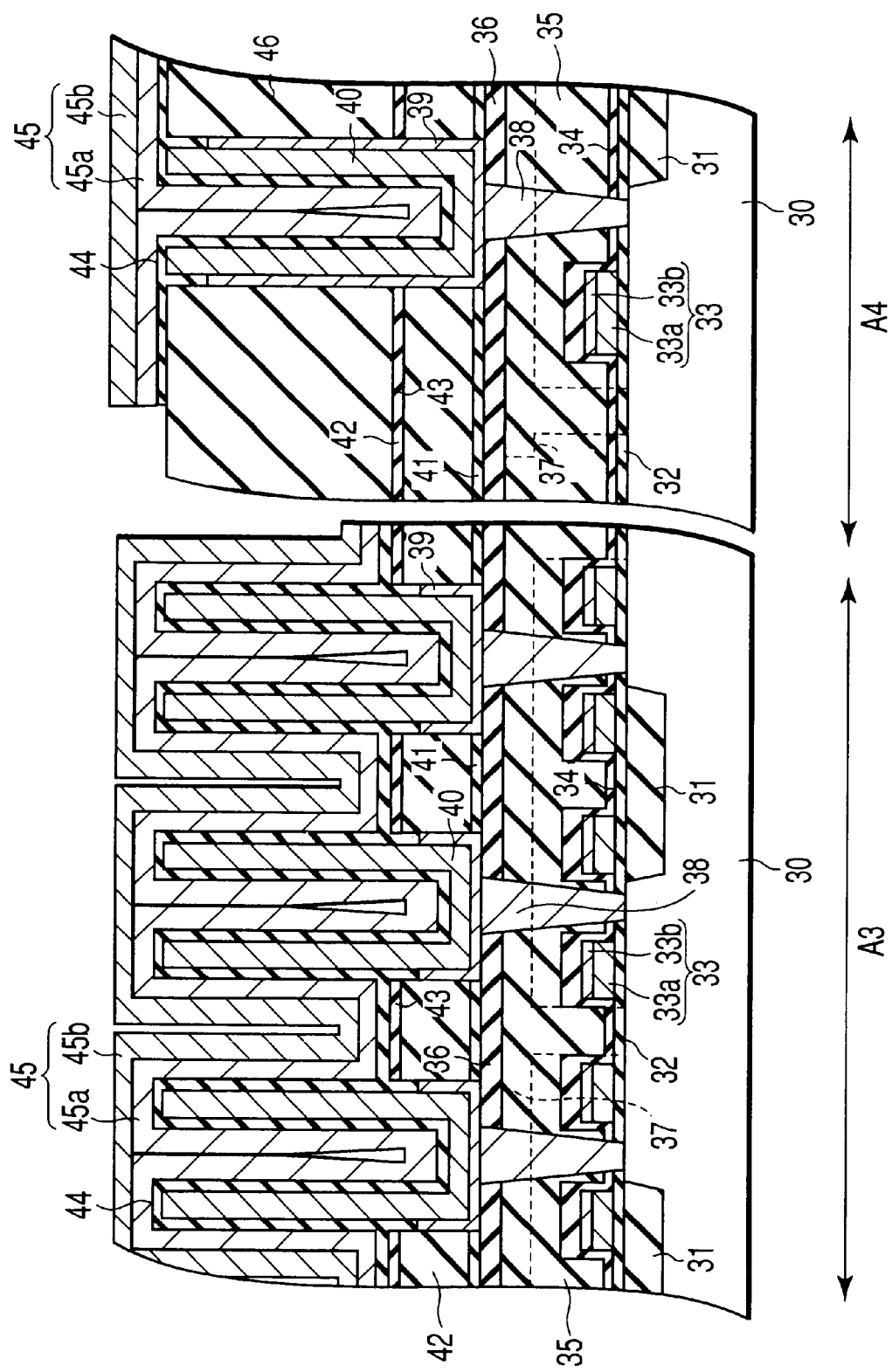

Next, as shown in FIG. 7B, a capacitor insulating film 44 is formed on the capacitor lower electrodes 40, silicon nitride films 43 and interlayer insulating film 46 by use of the CVD method or the like. The capacitor insulating film 44 is so formed as to fill portions of the liner film 39 which are recessed from the upper surfaces of the silicon nitride films 43 in the memory cell array area A3 and fill portions of the liner film 39 which are recessed from the upper surfaces of the interlayer insulating film 46 in the peripheral area A4. Further, in order to securely obtain a sufficiently large capacitance of the capacitor, a high-dielectric-constant film, for example, a tantalum oxide film ($Ta_2O_5$) having a larger dielectric constant than the silicon oxide film is used as a material of the capacitor insulating film 44. Then, a capacitor upper electrode 45 having a laminated structure of a ruthenium film 45a and titanium nitride film 45b is formed on the capacitor insulating film 44 by the CVD method or the like. After this, the capacitor insulating film 44 and capacitor upper electrode 45 are patterned into a desired pattern by use of the lithography technology and etching process to complete double-surface-cylinder type cell capacitors and double-surface-concave type fuse capacitors in the memory cell array area A3 and peripheral area A4, respectively.

Then, like the first embodiment, an interlayer insulating film 47 is formed on the cell capacitors and fuse capacitors and a metal interconnection layer 49 electrically connected to the capacitor upper electrode 45 is formed. Further, an interlayer insulating film 50 is formed on the interlayer insulating film 47 and metal interconnection layer 49 to complete a DRAM.

By the above fabricating method, a DRAM having the double-surface-cylinder type cell capacitors and double-surface-concave type fuse capacitors can be fabricated.

Further, in this embodiment, the same effect as that attained in the fabricating method of the first embodiment and explained with reference to FIGS. 5A to 5F can be obtained.

Figure 8:
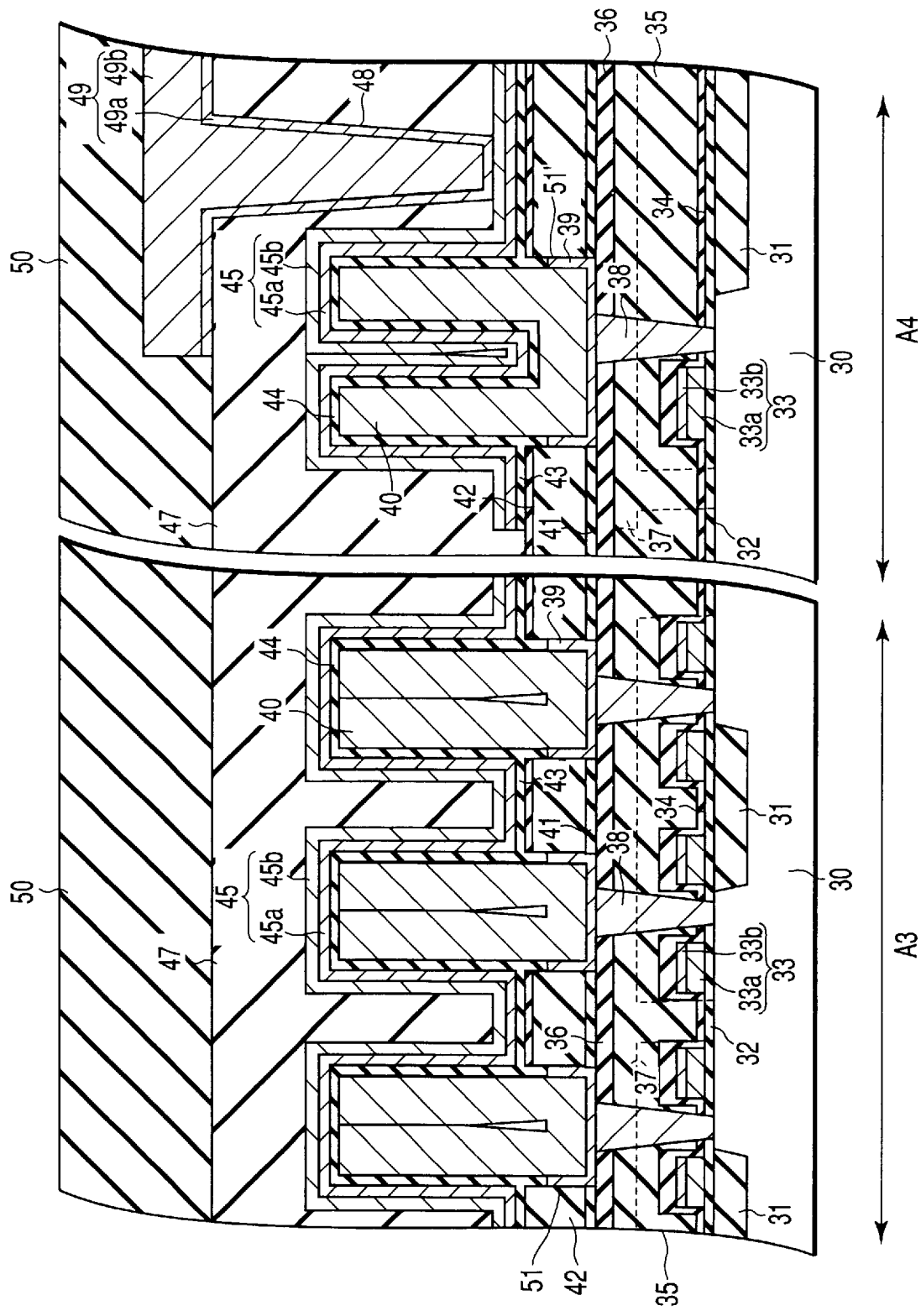
FIG. 8 is a cross sectional view showing a DRAM according to a third embodiment of this invention.

Next, a semiconductor device according to a third embodiment of this invention is explained with reference to FIG. 8. FIG. 8 is a cross sectional view showing a DRAM having outer-surface-pillar type capacitor structures as cell capacitors and double-surface-cylinder type capacitor structures as fuse capacitors. The structure shown below the silicon oxide film 36 is the same as that in the first embodiment, and therefore, the explanation thereof is omitted.

As shown in FIG. 8, outer-surface-pillar type cell capacitors are formed on the silicon oxide film 36 in the memory cell array area A3 and double-surface-cylinder type fuse capacitors are formed in the peripheral area A4. In a DRAM formed by use of the extremely advanced integration technology, in order to securely attain a sufficiently large capacitance of the capacitor, a high-dielectric-constant film, for example, a tantalum oxide film is used as the capacitor insulating film as described before, but recently, attempt is made to use a BSTO ($(Ba,Sr)TiO_3$) film or the like. However, the aspect ratio in the double-surface-cylinder type cell capacitor becomes large and it becomes difficult in some cases to maintain the excellent step coverage when the BSTO film is formed. Therefore, as the cell capacitor structure, it is preferable to use the outer-surface-pillar type capacitor rather than the double-surface-cylinder type capacitor in some cases. This embodiment is made by taking the above case into consideration.

An interlayer insulating film formed of a silicon nitride film 41, silicon oxide film 42 and silicon nitride film 43 is formed on the silicon oxide film 36. In the interlayer insulating film, cylindrical trenches 51, 51' reaching the silicon oxide film 36 are formed in the memory cell array area A3 and peripheral area A4, respectively. Contact plugs 38 are exposed to the bottom portions of the trenches 51, 51'. The trenches 51, 51' are provided for the respective contact plugs 38 and a liner film 39 is formed on the bottom and side surfaces of each of the trenches 51, 51'. The liner film 39 formed on the side surface of each of the trenches 51, 51' is recessed so as not to reach the upper surface of the silicon nitride film 43 and titanium nitride is used as a material thereof, for example.

Outer surface pillar type capacitor lower electrodes 40 having a column or pillar shape and double-surface-cylinder type lower electrodes 40 having a cylindrical shape are formed in the respective trenches 51, 51' so that a portion of each lower electrode extending from the bottom surface to a preset height will be filled in a corresponding one of the trenches. Each capacitor lower electrode 40 is electrically connected to a corresponding one of the contact plugs 38 via the liner film 39. The degree of adherence between the capacitor lower electrode 40 and the silicon oxide films 36, 42 and silicon nitride films 41, 43 is enhanced by the presence of the liner film 39. Further, capacitor insulating films 44 are respectively formed on the capacitor lower electrodes 40 and capacitor upper electrodes 45 are respectively formed on the capacitor insulating films 44 to form outer-surface-pillar type and double-surface-cylinder type stacked capacitors. For example, the capacitor upper electrode 45 has a two-layered structure including a ruthenium film 45a and titanium nitride film 45b.

Further, an interlayer insulating film 47 is formed on the capacitors. A contact hole 48 reaching the capacitor upper electrode 45 is formed in the interlayer insulating film 47 and a metal interconnection layer 49 filling the contact hole 48 is formed on the interlayer insulating film 47. The metal interconnection layer 49 has a two-layered structure including a barrier metal layer 49a and metal layer 49b, for example. Further, an interlayer insulating film 50 is formed on the interlayer insulating film 47 to form a DRAM.

As described above, according to the DRAM of the present embodiment, for example, a titanium nitride film is formed as the liner film 39 in portions in which the capacitor lower electrodes 40 are formed in contact with the silicon oxide film. Therefore, the degree of adhesion between the capacitor lower electrode 40 and the interlayer insulating film can be enhanced and thus the same effect as that obtained in the first embodiment can be attained.

In addition, while the outer-surface-pillar type capacitor structures are used as the cell capacitors, the double-surface-cylinder type capacitor structures are used as the fuse capacitors. Therefore, (1) it is necessary to increase the film thickness of the lower electrode 40 of the cell capacitor in order to fill the trench 51 of the memory cell array area A3. Accordingly, the film thickness of the lower electrode of the fuse capacitor is increased, and (2) it is necessary to increase the diameter of the bottom surface of the trench 51' so that the trench 51' of the peripheral area A4 will not be completely filled with the lower electrode with such large film thickness. As a result, the diameter of the bottom surface of the fuse capacitor is increased. Therefore, the fuse capacitor can be formed with the rigid structure. Thus, even if a sufficiently large process margin cannot be attained since the fuse capacitor pattern is formed as substantially an isolated pattern, the fuse capacitor structure is stable and fall of the capacitor can be prevented. As a result, the manufacturing yield of the fuse capacitor can be enhanced while the large capacitances of the capacitors in the memory cell array area are maintained and the manufacturing yield and reliability of the DRAM can be enhanced.

As the shape and size of the diameter of the capacitor bottom surface, it is preferable to set the bottom surface into a circular form with a radius of 0.2 μm or more in the peripheral area A4 when the bottom surface is formed in an elliptical form having the short side length of 0.11 μm in the memory cell array area A3.

Further, the double-surface-cylinder type capacitor has a larger number of portions in which the electric field is concentrated in comparison with the outer-surface-pillar type capacitor from the viewpoint of its structure. Therefore, if the same material is used for the capacitor insulating films of the cell capacitor and fuse capacitor, the dielectric breakdown voltage of the fuse capacitor can be set lower than that of the cell capacitor. As a result, the write voltage of the anti-fuse can be lowered.

Next, a method for fabricating the DRAM with the above structure is explained with reference to FIGS. 9A to 9E. FIGS. 9A to 9E are cross sectional views for illustrating the manufacturing process.

First, the structure shown in FIG. 4B is formed by the process explained in the first embodiment.

Figure 9A:
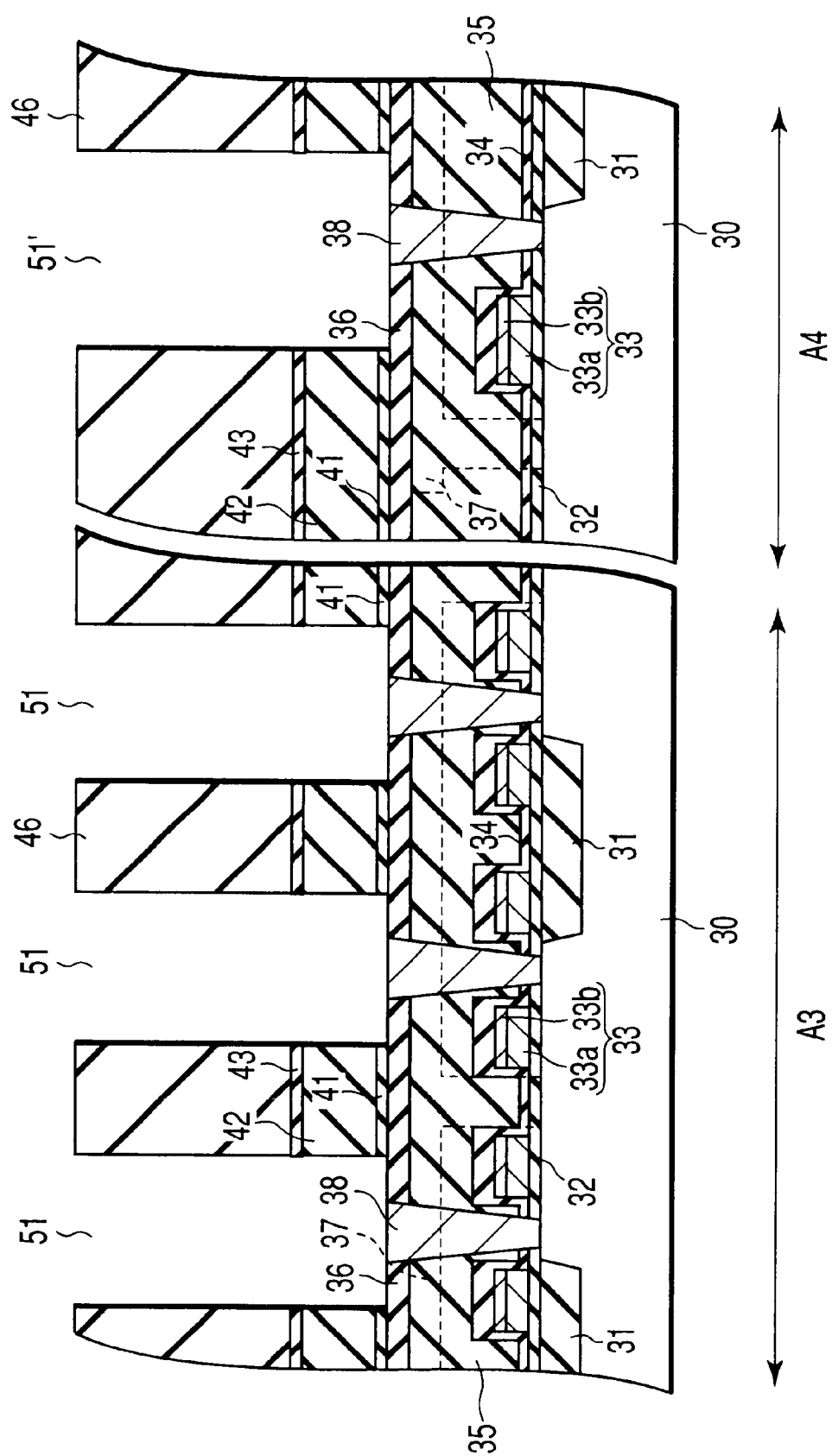
FIGS. 9A to 9E are cross sectional views showing the manufacturing process of the DRAM according to the third embodiment of this invention.

Next, as shown in FIG. 9A, silicon nitride films 41, 43 and silicon oxide films 42, 46 in capacitor forming areas in the memory cell array area and peripheral area are etched to form trench portions 51, 51' by use of the lithography technology and RIE method according to the process explained in the first embodiment. At this time, the etching process is effected to expose the upper surfaces of contact plugs 38 to the bottom portions of the trench portions 51, 51'. Further, the diameter of the trench portion 51' in the peripheral area A4 is set sufficiently larger than that of the trench portion 51 in the memory cell array area A3.

Figure 9B:
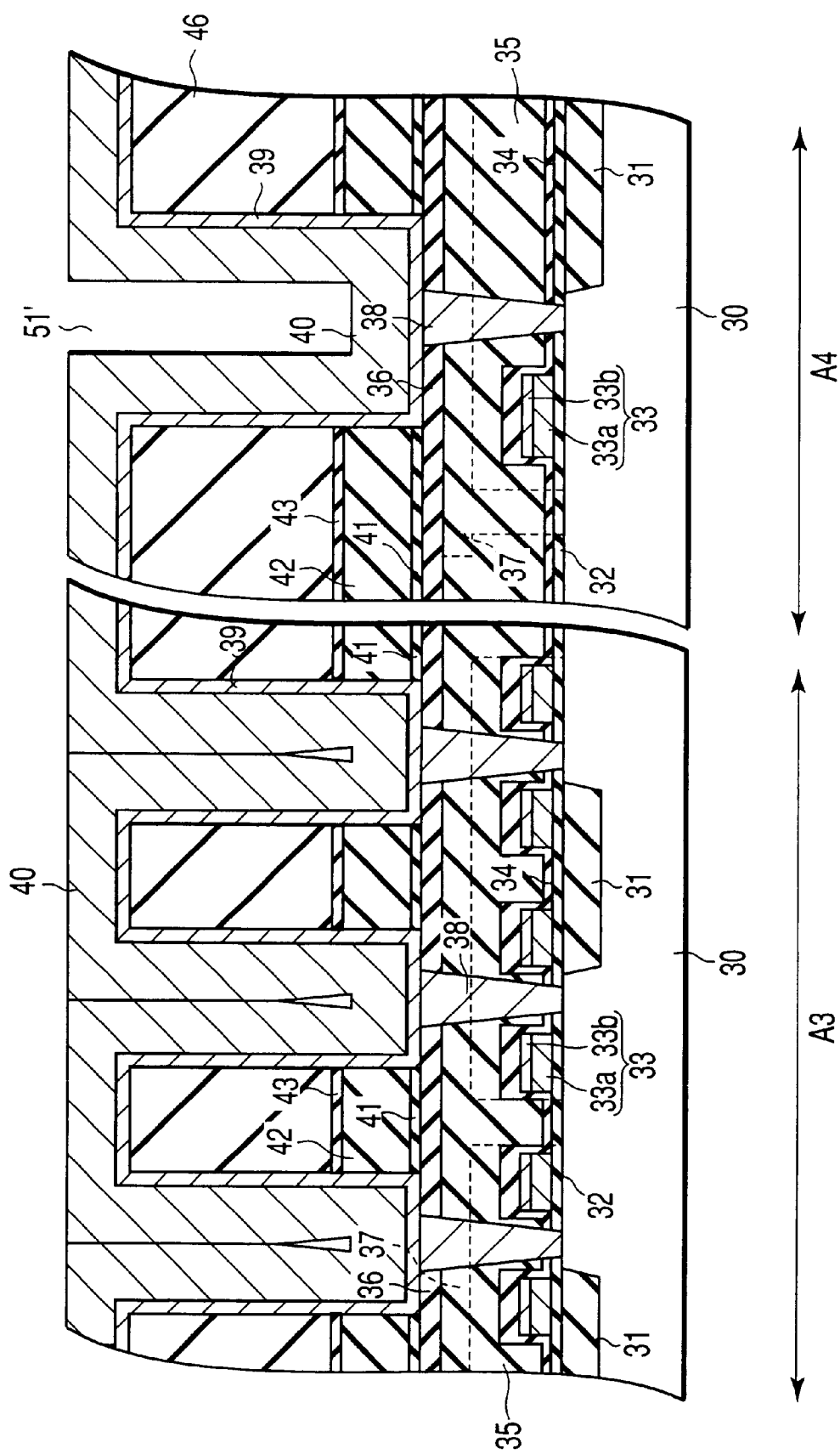

Next, as shown in FIG. 9B, a liner film 39 is formed on the silicon nitride film 46 and the inner surfaces of the trench portions 51, 51' by use of the CVD method or the like. Then, capacitor lower electrodes 40 are formed on the liner film 39 by the CVD method or the like. As a material of the capacitor lower electrode 40, a conductive film of ruthenium in the platinum group, for example, is used. Further, the capacitor lower electrode 40 is used as a storage node electrode of the cell capacitor in the memory cell array area A3. Further, the capacitor lower electrode 40 is formed with such film thickness as to substantially completely fill the trench portion 51 in the memory cell array area A3. At this time, it is necessary to prevent the trench portion 51' in the peripheral area A4 from being completely filled with the capacitor lower electrode 40. That is, in the step of FIG. 9A, it is necessary to form the trench portion 51' to have such a diameter which does not cause the trench portion 51' to be filled with the capacitor lower electrode in the present step.

Figure 9C:
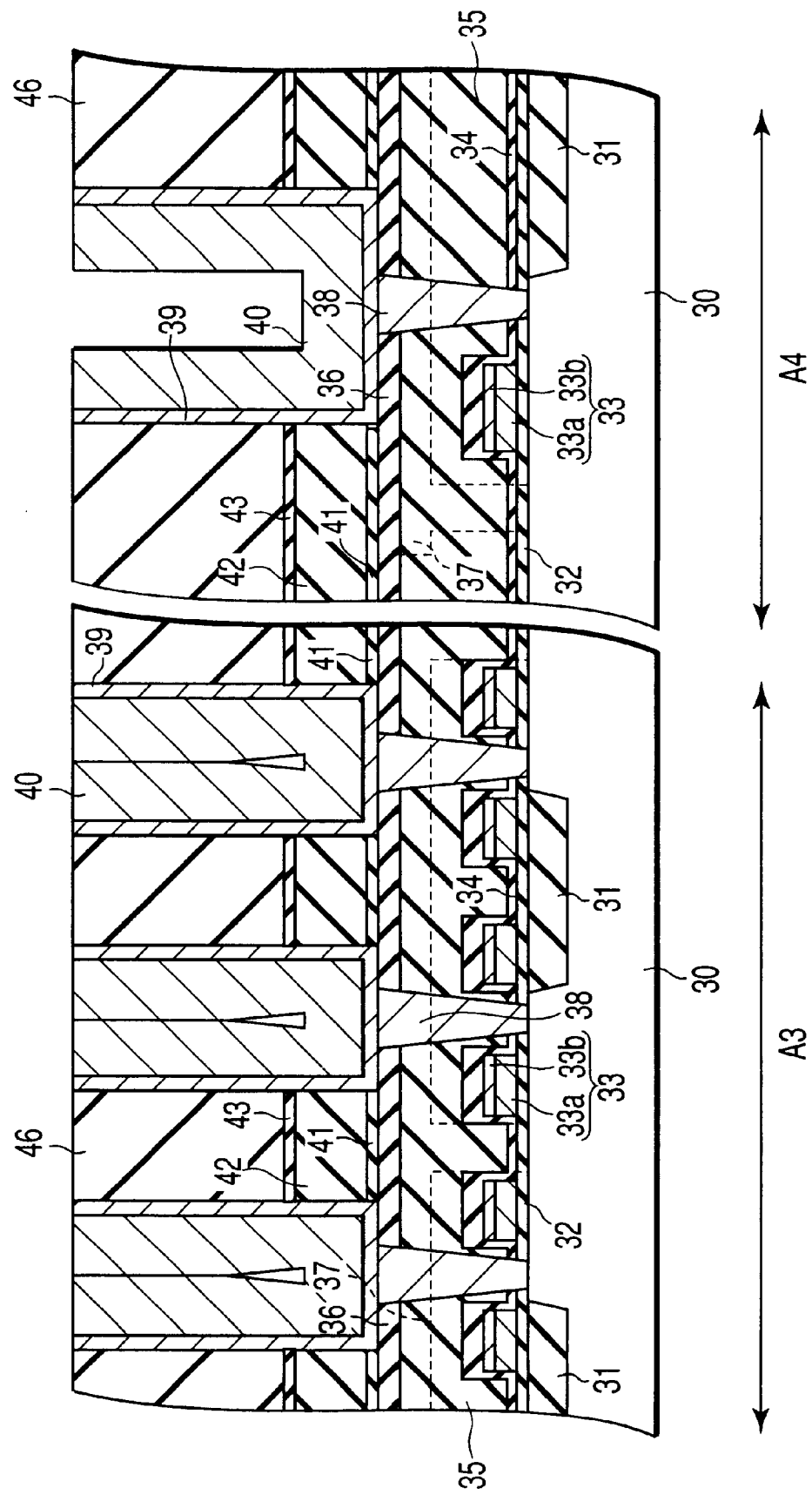
Figure 9D:
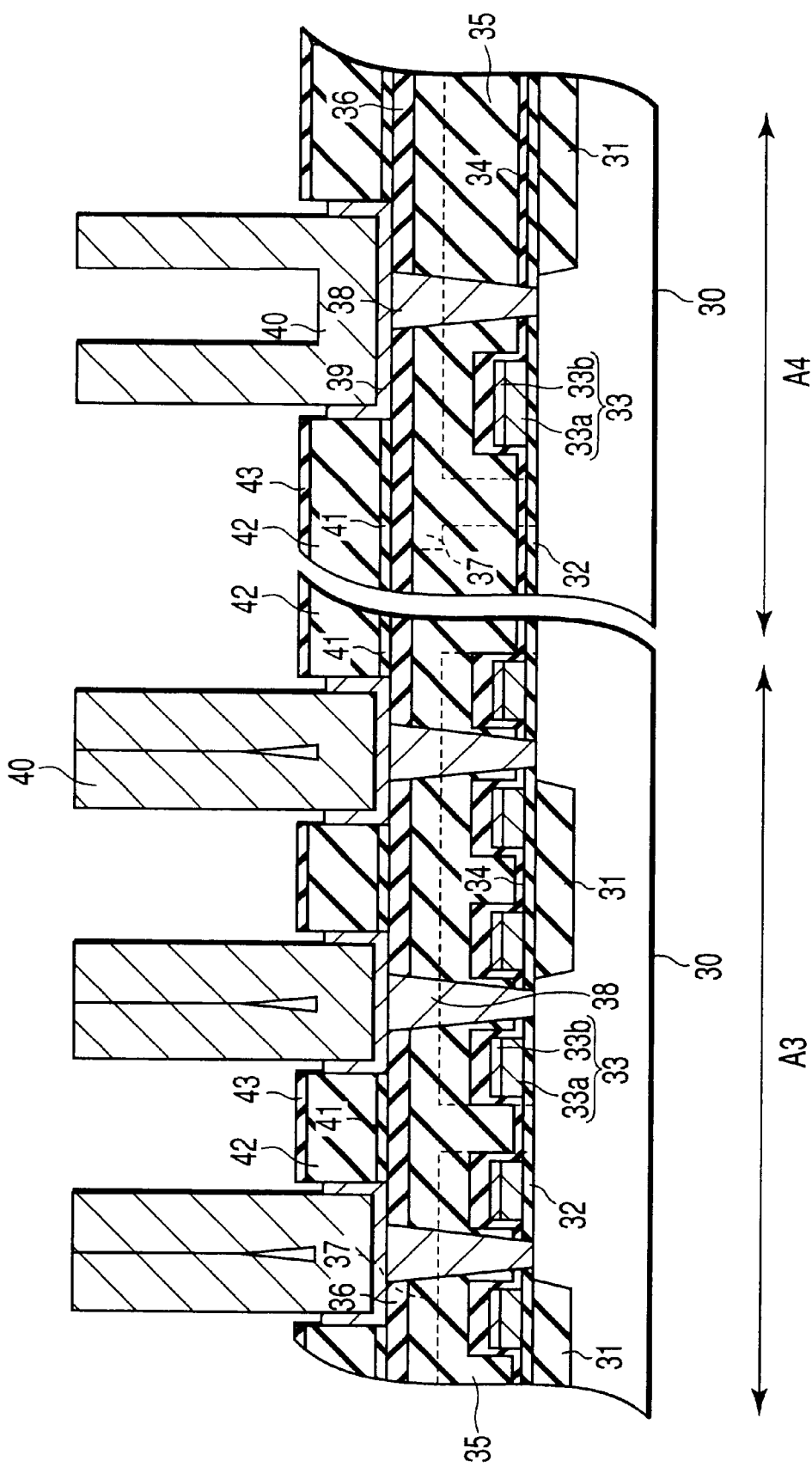

Next, as shown in FIG. 9C, the liner film 39 and capacitor lower electrodes 40 lying on the upper surfaces of the silicon oxide films 46 are polished and removed by use of the CMP method or the like.

After this, the silicon oxide films 46 are first removed by the wet etching method or the like using the silicon nitride film 43 as a stopper. Then, part of the liner film 39 is removed by, for example, the wet etching method using a mixture of sulfuric acid and hydrogen peroxide solution to form a structure shown in FIG. 9D. That is, outer-surface-pillar type cell capacitor lower electrodes which are separated for respective bits are completed in the memory cell array area A3 in which the trench portions 51 are almost completely filled with the capacitor lower electrodes 40. Further, double-surface-cylinder type fuse capacitor lower electrodes 40 are completed in the peripheral area A4 in which the trench portions 51' are not completely filled with the capacitor lower electrodes 40 because the diameters of the trench portions 51' are large. When the liner film 39 is etched, the etching process is effected to recess the liner film 39 so that the upper surface of the liner film 39 will become lower than at least the upper surface of the silicon nitride film 43.

Figure 9E:
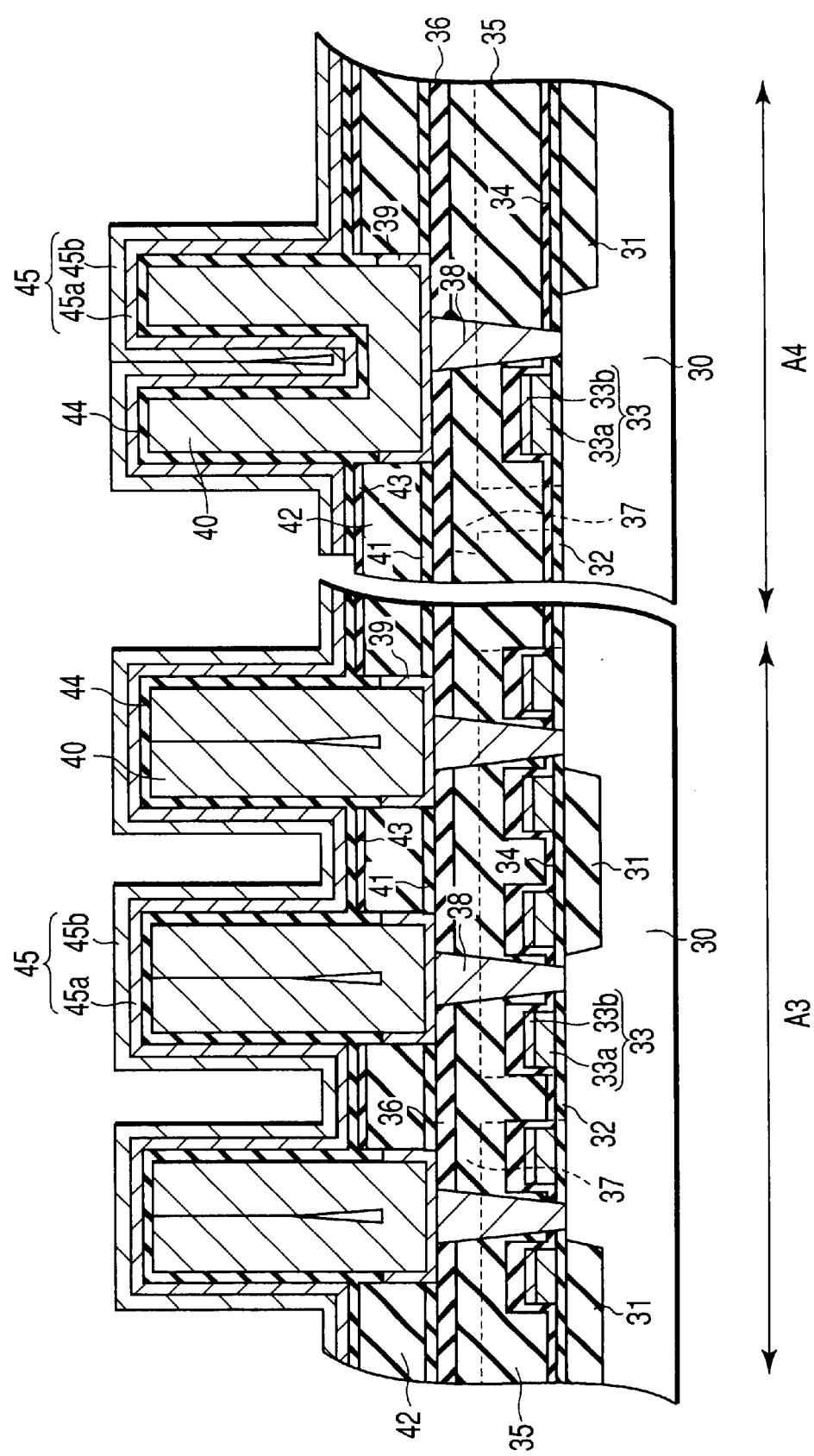

Next, as shown in FIG. 9E, a capacitor insulating film 44 is formed on the capacitor lower electrodes 40 and silicon nitride films 43 by the CVD method or the like. In this case, the capacitor insulating film 44 is formed to fill portions of the liner film 39 which are recessed from the upper surface of the silicon nitride film 43. Further, in order to securely obtain a sufficiently large capacitance of the capacitor, a high-dielectric-constant film, for example, a BSTO film is used as a material of the capacitor insulating film 44. Then, a capacitor upper electrode 45 having a laminated structure of a ruthenium film 45a and titanium nitride film 45b is formed on the capacitor insulating film 44 by the CVD method or the like. After this, the capacitor insulating film 44 and capacitor upper electrode 45 are patterned into a desired pattern by use of the lithography technology and etching process to complete outer-surface-pillar type cell capacitors and double-surface-cylinder type fuse capacitors in the memory cell array area A3 and peripheral area A4, respectively.

Then, like the first embodiment, interlayer insulating films 47, 50 and metal interconnection layer 49 are formed to complete a DRAM with the structure shown in FIG. 8.

A DRAM having the outer-surface-pillar type cell capacitors and double-surface-cylinder type fuse capacitors can be fabricated by the above fabricating method.

Further, the same effect as that obtained in the fabricating method of the first embodiment and explained with reference to FIGS. 5A to 5F can be attained.

In addition, the shapes of the cell capacitor and fuse capacitor can be made different from each other at the same manufacturing cost as in the conventional case without increasing a special step.

Further, when the capacitor insulating film is formed, material gas easily flows in the memory cell array area since the outer-surface-pillar type capacitor lower electrodes are formed and preferable step coverage can be easily attained at the time of film formation by the CVD method. On the other hand, in the peripheral area, since the double-surface-cylinder type capacitor lower electrodes are formed, material gas does not smoothly flow in the cylinder and it is difficult to attain preferable step coverage. Therefore, the film thickness of the capacitor insulating film in the cylinder becomes smaller than that of the capacitor insulating film of the cell capacitor. As a result, the dielectric breakdown voltage of the fuse capacitor is lowered and the write voltage to the anti-fuse can be lowered.

In the present embodiment, the BSTO film which causes poor step coverage at the time of film formation by the CVD method is used as the material of the capacitor insulating film, but it is not limited to the above material and another material such as a $Ta_2O_5$ film may be used in order to improve the step coverage.

According to the DRAM of the third embodiment, the manufacturing yield and reliability of the DRAM can be enhanced and the write voltage to the anti-fuse can be lowered.

Figure 10:
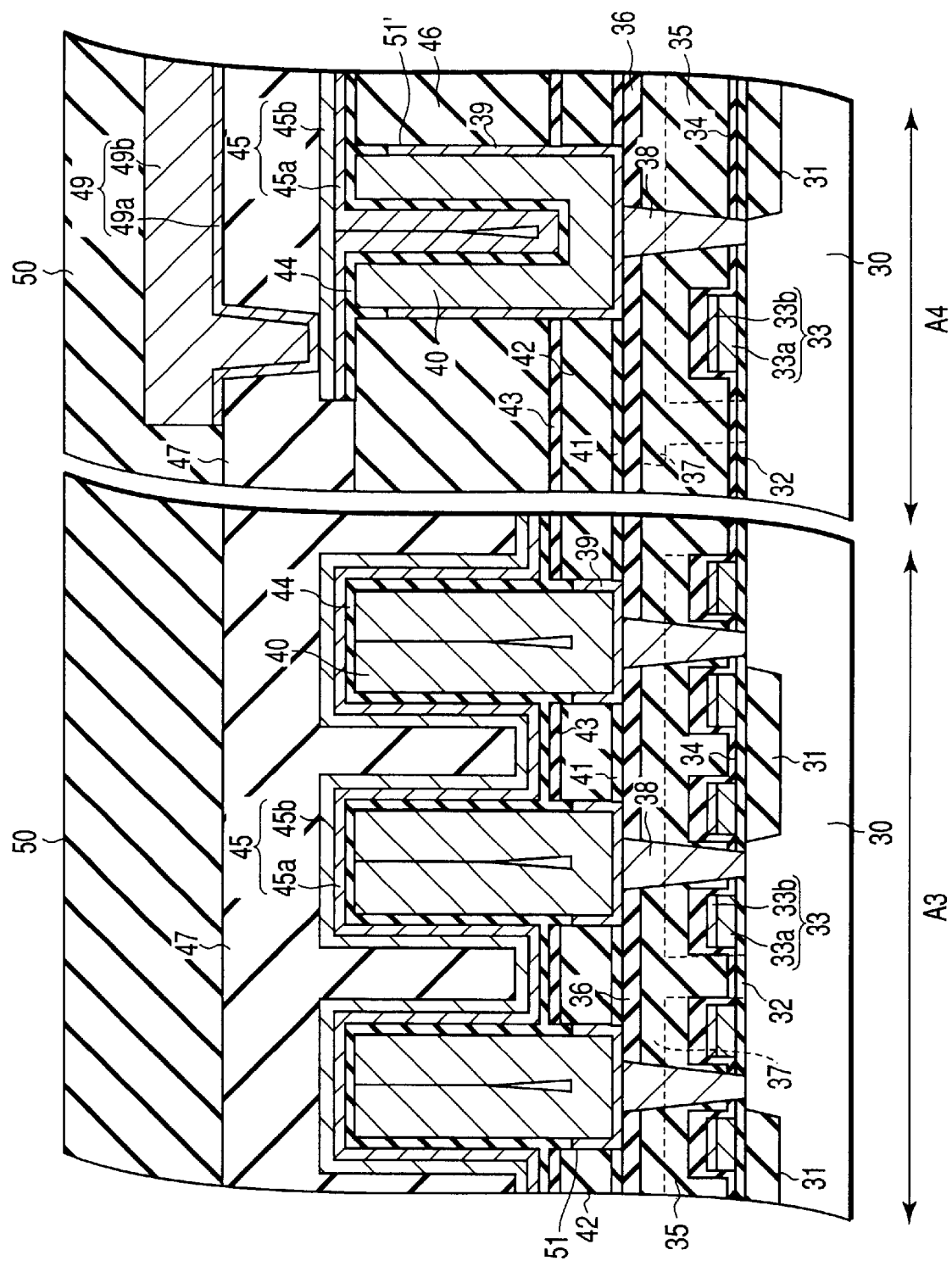
FIG. 10 is a cross sectional view showing a DRAM according to a fourth embodiment of this invention.

Next, a semiconductor device according to a fourth embodiment is explained with reference to FIG. 10. FIG. 10 is a cross sectional view showing a DRAM having outer-surface-pillar type capacitor structures as cell capacitors and double-surface-concave type capacitor structures as fuse capacitors.

As shown in FIG. 10, outer-surface-pillar type cell capacitors are formed in a memory cell array area A3 on a silicon oxide film 36 and double-surface-concave type fuse capacitors are formed in a peripheral area A4. The structure shown below the silicon oxide film 36 is the same as that in the first embodiment, and therefore, the explanation thereof is omitted.

In the memory cell array area A3, an interlayer insulating film formed of a silicon nitride film 41, silicon oxide film 42 and silicon nitride film 43 is formed on the silicon oxide film 36. In the interlayer insulating film, cylindrical trenches 51 reaching the silicon oxide film 36 are formed. Contact plugs 38 are exposed to the bottom portions of the trenches 51. The trenches 51 are provided for the respective contact plugs 38 and a liner film 39 is formed on the bottom and side surfaces of the trenches 51. The liner film 39 formed on the side surface of the trench 51 is recessed so as not to reach the upper surface of the silicon nitride film 43 and titanium nitride is used as a material thereof, for example.

Outer surface pillar type capacitor lower electrodes 40 having a column or pillar shape are so formed that a portion of each lower electrode extending from the bottom surface to a preset height thereof will be buried in a corresponding one of the trenches 51. The capacitor lower electrode 40 is electrically connected to a corresponding one of the contact plugs 38 via the liner film 39. The degree of adherence between the capacitor lower electrode 40 and the silicon oxide films 36, 42 and silicon nitride films 41, 43 is enhanced by the presence of the liner film 39. Further, capacitor insulating films 44 are respectively formed on the capacitor lower electrodes 40 and capacitor upper electrodes 45 are respectively formed on the capacitor insulating films 44 to form outer-surface-pillar type stacked capacitors. For example, the capacitor upper electrode 45 has a two-layered structure including a ruthenium film 45a and titanium nitride film 45b.

Further, an interlayer insulating film formed of the silicon nitride film 41, silicon oxide film 42 and silicon nitride film 43 is formed on the silicon oxide film 36 in the peripheral area A4. An interlayer insulating film 46 having such film thickness that the upper surface thereof become substantially in flash with the upper surface of the lower electrode 40 in the memory cell array area A3 is formed on the silicon nitride film 43. Cylindrical trenches 51' reaching the silicon oxide film 36 are formed in an interlayer insulating film formed of the interlayer insulating film 46, silicon nitride films 41, 43 and silicon oxide film 42. Contact plugs 38 are exposed in the bottom portions of the trenches 51'. The trenches 51' are provided for the respective contact plugs 38 and a liner film 39 is formed on the bottom and side surfaces of the trenches 51. The liner film 39 formed on the side surface of the trench 51' is recessed so as not to reach the upper surface of the interlayer insulating film 46 and titanium nitride is used as a material thereof, for example.

Cylinder type capacitor lower electrodes 40 having a cylindrical shape are formed in the respective trenches 51'. Each capacitor lower electrode 40 is electrically connected to a corresponding one of the contact plugs 38 via the liner film 39. The degree of adherence between the capacitor lower electrode 40 and the interlayer insulating film 46, silicon oxide films 36, 42 and silicon nitride films 41, 43 is enhanced by the presence of the liner film 39. Further, capacitor insulating films 44 are respectively formed on the capacitor lower electrodes 40 and capacitor upper electrodes 45 are respectively formed on the capacitor insulating films 44 to form double-surface-concave type stacked capacitors. For example, the capacitor upper electrode 45 has a two-layered structure including a ruthenium film 45a and titanium nitride film 45b.

Further, an interlayer insulating film 47 is formed on the cell capacitors and fuse capacitors. A contact hole 48 reaching the capacitor upper electrode 45 is formed in the interlayer insulating film 47 and a metal interconnection layer 49 filling the contact hole 48 is formed on the interlayer insulating film 47. The metal interconnection layer 49 has a two-layered structure including a barrier metal layer 49a and metal layer 49b, for example. Further, an interlayer insulating film 50 is formed on the interlayer insulating film 47 to form a DRAM.

As described above, according to the DRAM of the present embodiment, for example, a titanium nitride film is formed as the liner film 39 in a portion in which the capacitor lower electrode 40 is formed in contact with the silicon oxide film. Therefore, the degree of adhesion between the capacitor lower electrode 40 and the interlayer insulating film can be enhanced and thus the same effect as that obtained in the first embodiment can be attained.

Further, the outer-surface-pillar type capacitor structures are used as the cell capacitors and the double-surfaceconcave type capacitor structures are used as the fuse capacitors. Therefore, (1) the capacitor lower electrode of the fuse capacitor is so formed as to be supported by the interlayer insulating film and (2) it is necessary to increase the film thickness of the lower electrode of the cell capacitor in order to completely fill the trench 51 in the memory cell array area A3. Accordingly, the film thickness of the fuse capacitor becomes large and (3) it is necessary to increase the diameter of the bottom surface of the trench 51' in order to prevent the trench 51' in the peripheral area from being substantially completely filled with the lower electrode with such large film thickness. As a result, the diameter of the bottom surface of the fuse capacitor is increased and the fuse capacitor can be formed with a rigid structure. Therefore, even if a sufficiently large process margin cannot be attained since the fuse capacitor pattern is formed as substantially an isolated pattern, the fuse capacitor structure is stable and fall of the capacitor can be prevented. As a result, the manufacturing yield of the fuse capacitor can be enhanced while the large capacitances of the cell capacitors in the memory cell array area are maintained and the manufacturing yield and reliability of the DRAM can be enhanced.

Next, a method for fabricating the DRAM with the above structure is explained with reference to FIGS. 11A to 11E. FIGS. 11A to 11E are cross sectional views for illustrating the fabricating method of the DRAM.

First, the structure shown in FIG. 4B is formed by the process explained in the first embodiment.

Figure 11A:
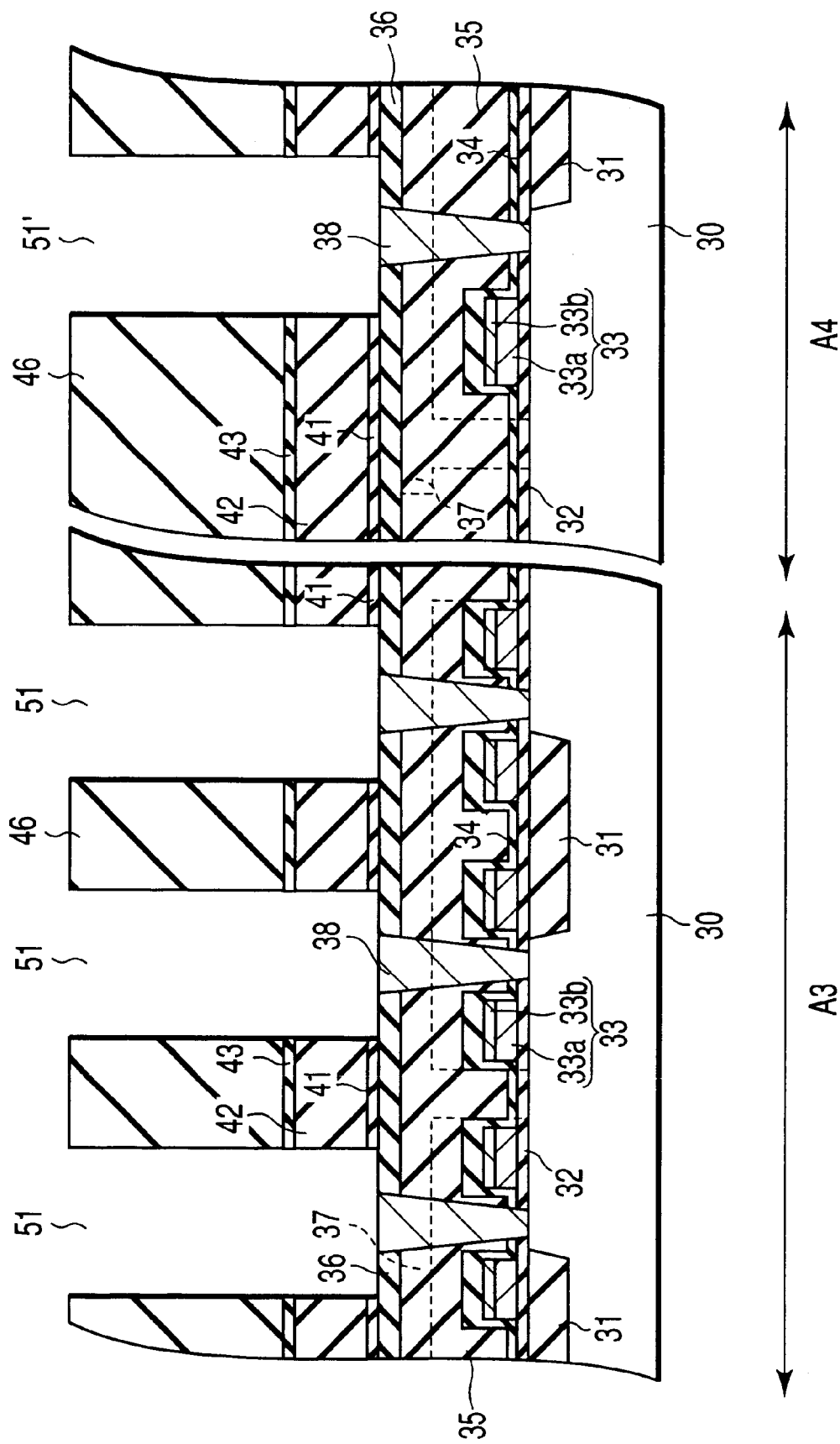
FIGS. 11A to 11E are cross sectional views showing the manufacturing process of the DRAM according to the fourth embodiment of this invention.

Next, as shown in FIG. 11A, silicon nitride films 41, 43 and silicon oxide films 42, 46 in capacitor forming areas in the memory cell array area and peripheral area are etched to form trench portions 51, 51' by use of the lithography technology and RIE method. At this time, the etching process is effected to expose the upper surfaces of contact plugs 38 in the bottom portions of the trench portions 51, 51'. Further, the diameter of the trench portion 51' in the peripheral area A4 is set sufficiently larger than that of the trench portion 51 in the memory cell array area A3.

Figure 11B:
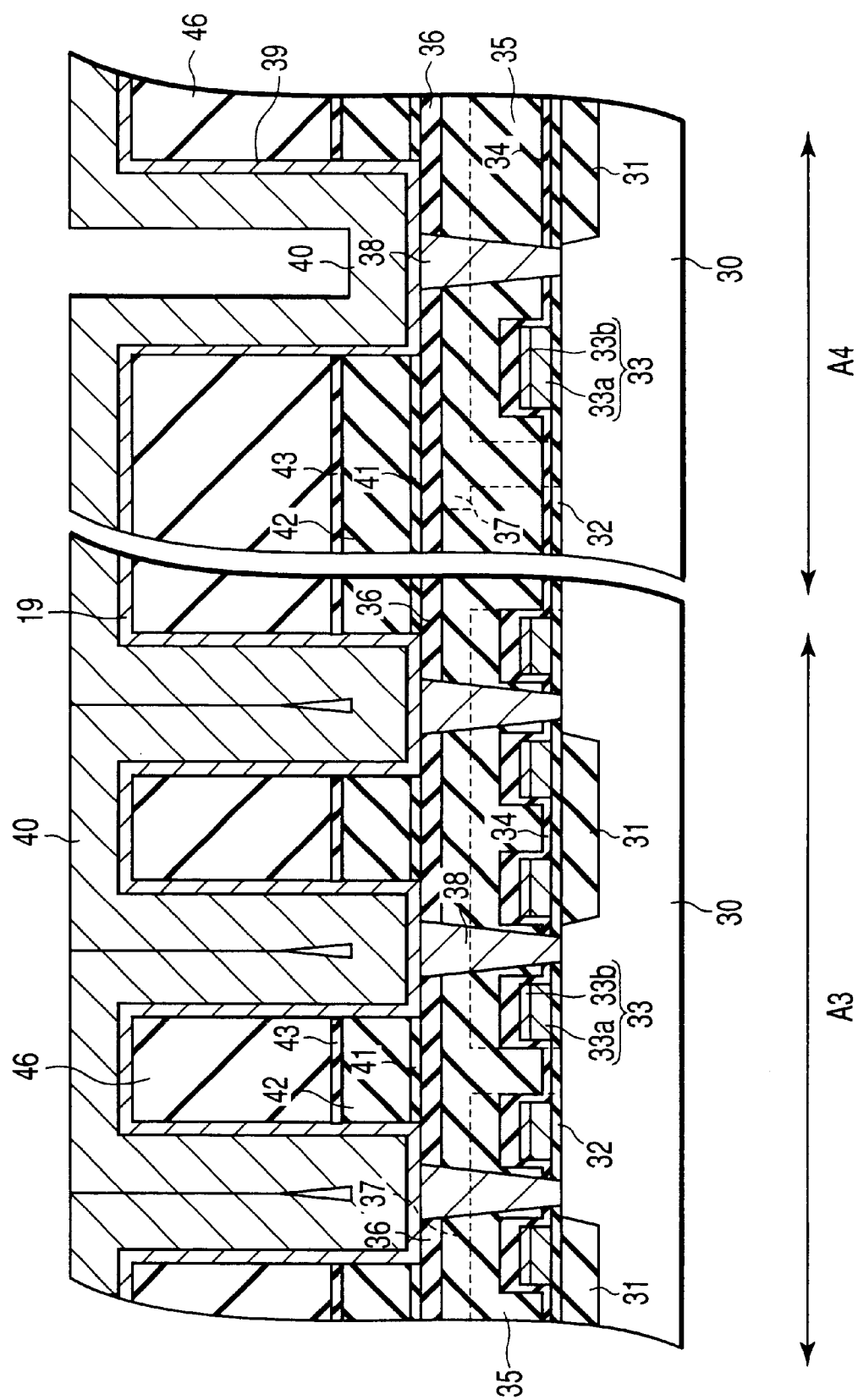

Next, as shown in FIG. 11B, a liner film 39 is formed on the silicon nitride film 46 and the inner surfaces of the trench portions 51, 51' by use of the CVD method or the like. Then, capacitor lower electrodes 40 are formed on the liner film 39 by the CVD method or the like. As a material of the capacitor lower electrode 40, a conductive film such as ruthenium in the platinum group is used, for example. Further, the capacitor lower electrode 40 is used as a storage node electrode of the cell capacitor in the memory cell array area A3. Further, the capacitor lower electrode 40 is formed with such film thickness as to substantially completely fill the trench portion 51 in the memory cell array area A3.

Figure 11C:
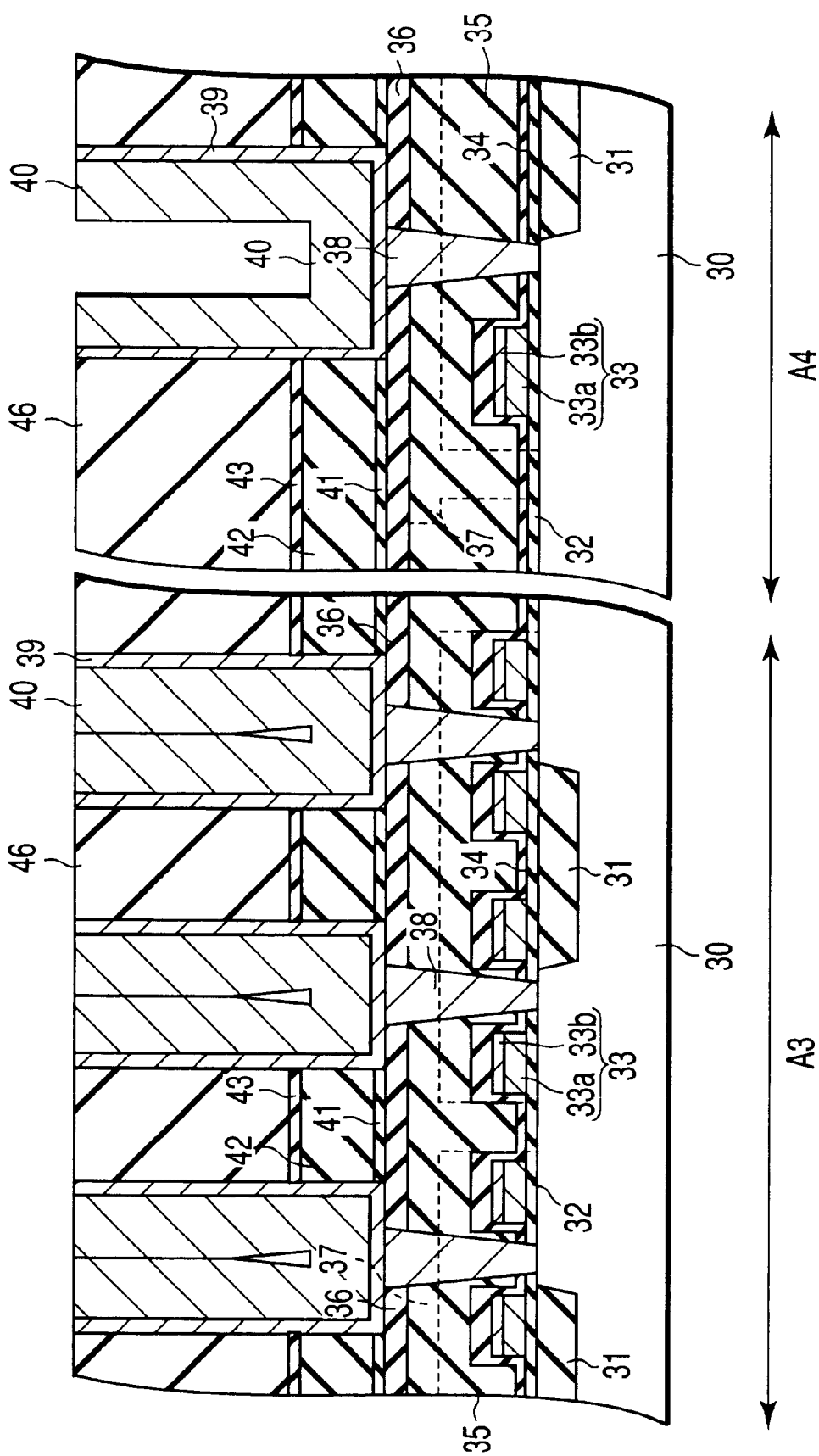
Figure 11D:
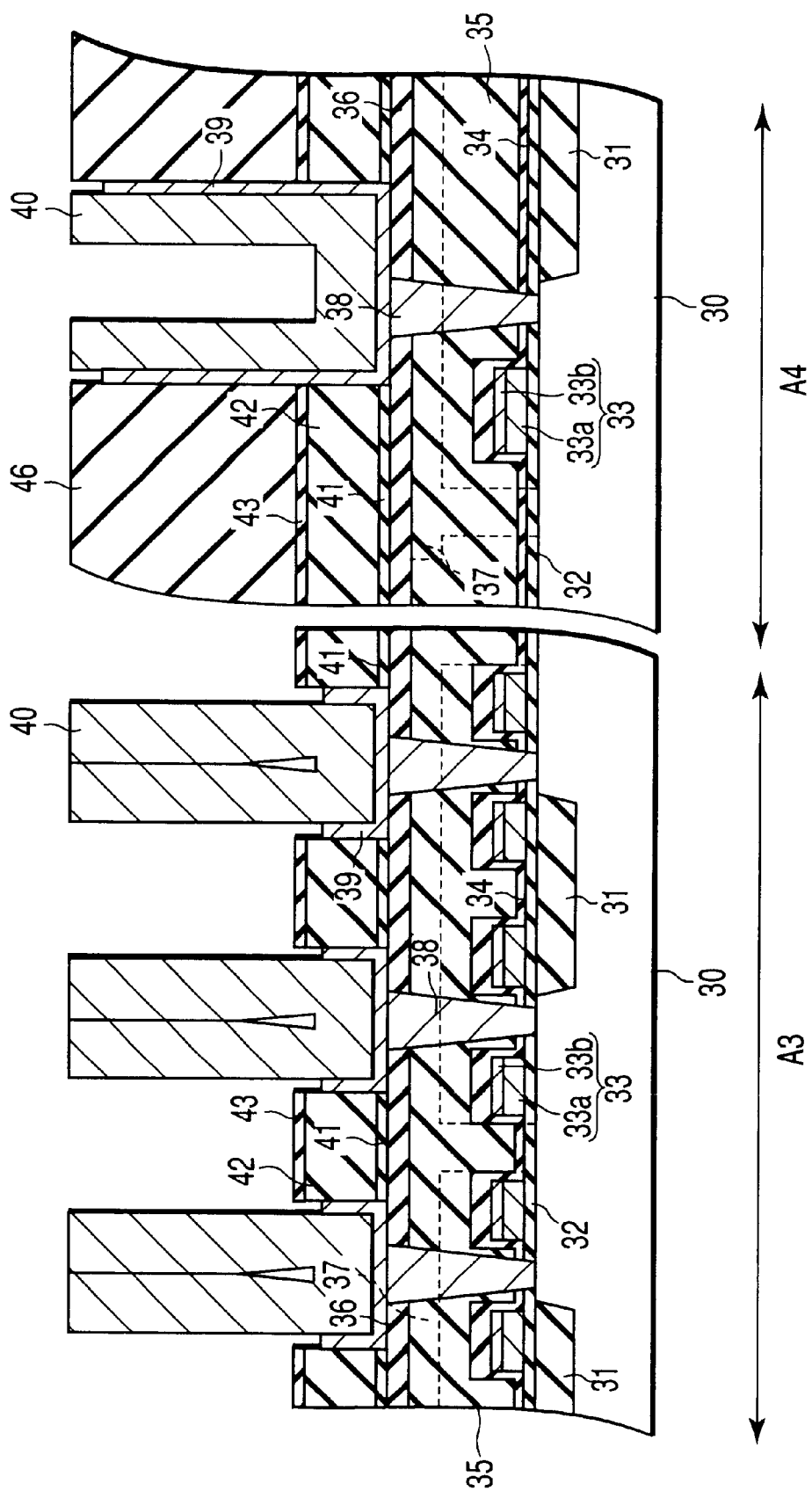

Next, as shown in FIG. 11C, the liner film 39 and capacitor lower electrodes 40 lying on the upper surfaces of the silicon oxide films 46 are polished and removed by use of the CMP method or the like.

After this, a resist is coated on the interlayer insulating films 46 and capacitor lower electrodes 40 in the memory cell array area A3 and peripheral area A4. Then, the resist in the memory cell array area A3 is removed by the lithography technology. Next, the silicon oxide films 46 in the memory cell array area A3 are removed while the silicon oxide films 46 in the peripheral area A4 are protected by the resist. Then, the resist remaining in the peripheral area A4 is removed by ashing or the like. After this, part of the line member 39 is removed by, for example, the wet etching method using a mixture of sulfuric acid and hydrogen peroxide solution to form a structure shown in FIG. 11D. That is, outer-surface-pillar type cell capacitor lower electrodes which are separately formed for respective bits in the memory cell array area A3 are completed in the present step. Further, double-surface-concave type fuse capacitor lower electrodes 40 are completed in the peripheral area A4. When the liner film 39 is etched, the etching process is effected to recess the liner film 39 until the upper surface of the liner film 39 becomes lower than at least the upper surface of the silicon nitride film 43 in the memory cell array area A3 and until it becomes lower than at least the upper surface of the interlayer insulating film 46 in the peripheral area A4.

Figure 11E:
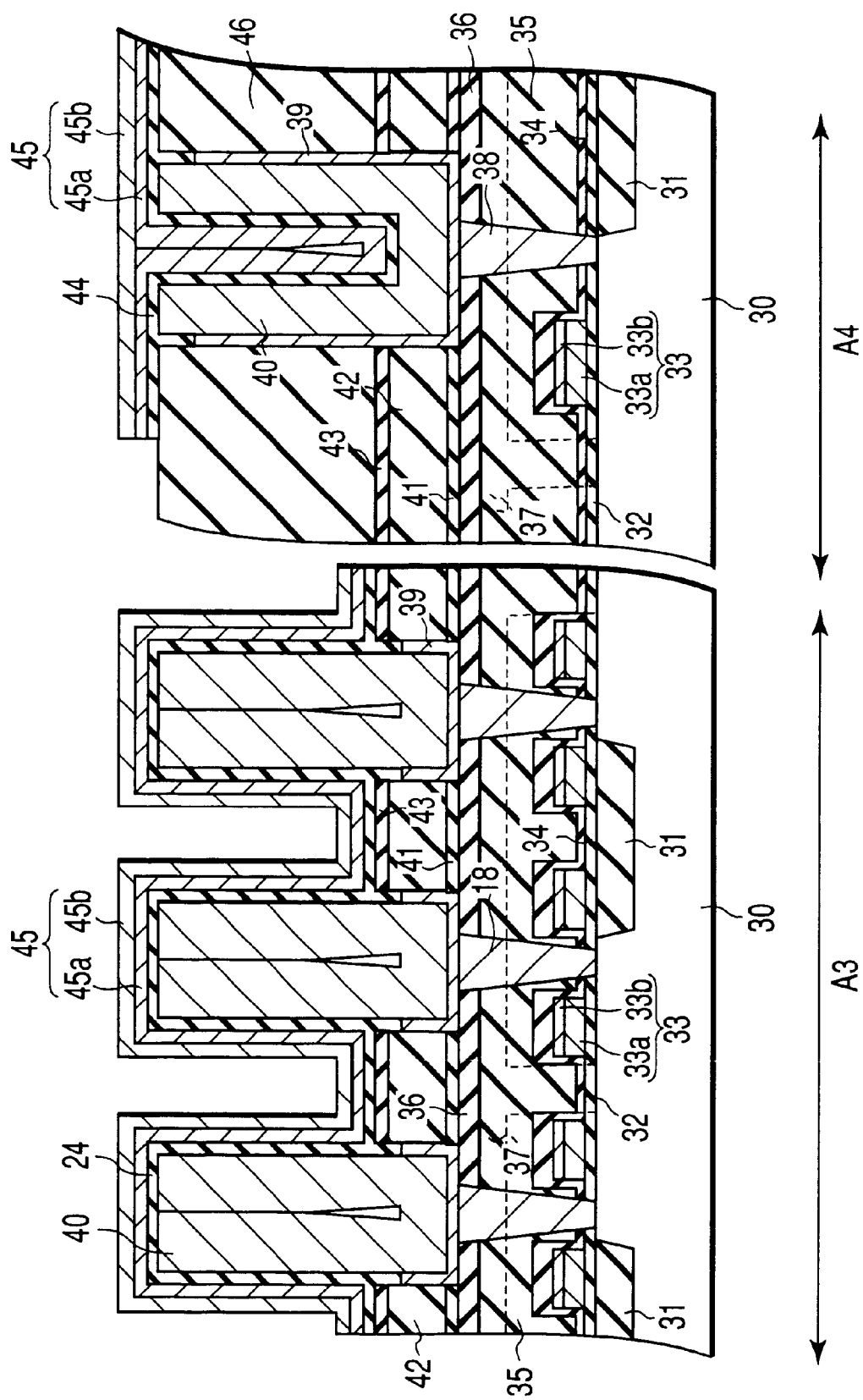

Next, as shown in FIG. 11E, a capacitor insulating film 44 is formed on the capacitor lower electrodes 40, silicon nitride films 43 and interlayer insulating film 46 by the CVD method or the like. In this case, the capacitor insulating film 44 is so formed as to fill portions of the liner film 39 which are recessed from the upper surface of the silicon nitride film 43 in the memory cell array area A3 and portions of the liner film 39 which are recessed from the upper surface of the interlayer insulating film 46 in the peripheral area A4. Further, in order to securely obtain a sufficiently large capacitance of the capacitor, a high-dielectric-constant film, for example, a tantalum oxide ($Ta_2O_5$) film having a larger dielectric constant in comparison with the silicon oxide film is used as the capacitor insulating film 44. Then, a capacitor upper electrode 45 having a laminated structure of a ruthenium film 45a and titanium nitride film 45b is formed on the capacitor insulating film 44 by the CVD method or the like. After this, the capacitor insulating film 44 and capacitor upper electrode 45 are patterned into a desired pattern by use of the lithography technology and etching process to complete outer-surface-pillar type cell capacitors and double-surface-concave type fuse capacitors in the memory cell array area A3 and peripheral area A4, respectively.

Then, like the first embodiment, an interlayer insulating film 47 is formed on the cell capacitors and fuse capacitors and a metal interconnection layer 49 electrically connected to the capacitor upper electrode 45 is formed. Further, an interlayer insulating film 50 is formed on the interlayer insulating film 47 and metal interconnection layer 49 to complete a DRAM with the structure shown in FIG. 10.

A DRAM having the outer-surface-pillar type cell capacitors and double-surface-concave type fuse capacitors can be fabricated by the above fabricating method.

Further, the same effect as that obtained in the fabricating method of the first embodiment and explained with reference to FIGS. 5A to 5F can be attained.

In addition, like the third embodiment, the film thickness of the capacitor insulating film of the fuse capacitor can be made smaller than that of the capacitor insulating film of the cell capacitor. Therefore, the dielectric breakdown voltage of only the fuse capacitor can be lowered.

According to the DRAM of the fourth embodiment, the manufacturing yield and reliability of the DRAM can be enhanced and the write voltage to the anti-fuse can be lowered.

In the first to fourth embodiments, a case wherein ruthenium (Ru) is used as the material of the capacitor electrode, barium-strontium titanate (BSTO) or tantalum oxide ($Ta_2O_5$) which is high-dielectric-constant substance is used as the material of the capacitor insulating film, and titanium nitride (TiN) is used as the material of the capacitor insulating film is explained. However, as the electrode material, other conductive films of a platinum group including platinum (Pt), iridium (Ir), palladium (Pd), osmium (Os), rhodium (Rh) and oxide of these substances such as ruthenium oxide (RuO$_2$), iridium oxide (IrO$_2$) can be used. Further, a high-dielectric-constant material or a ferroelectric material such as a strontium titanate (STO) film, lead zirconate titanate (PZT) film or SBT film can be used as the material of the capacitor insulating film. In addition, as the material of the liner film, tungsten nitride (WN), tantalum nitride (TaN), or compounds of these substance and silicon (Si) or alminum (Al) such as TiSiN, TaSiN, and TiAlN can be used in addition to titanium nitride. It is preferable to make a combination of ruthenium as the materials of the capacitor electrode, tantalum oxide as the capacitor insulating film and tinatium nitride as the liner film.

In the drawings used for explaining the first and second embodiments, the cell capacitor and fuse capacitor are shown to have substantially the same size, but in practice, it is preferable to make the fuse capacitor larger than the cell capacitor.

Figure 1:
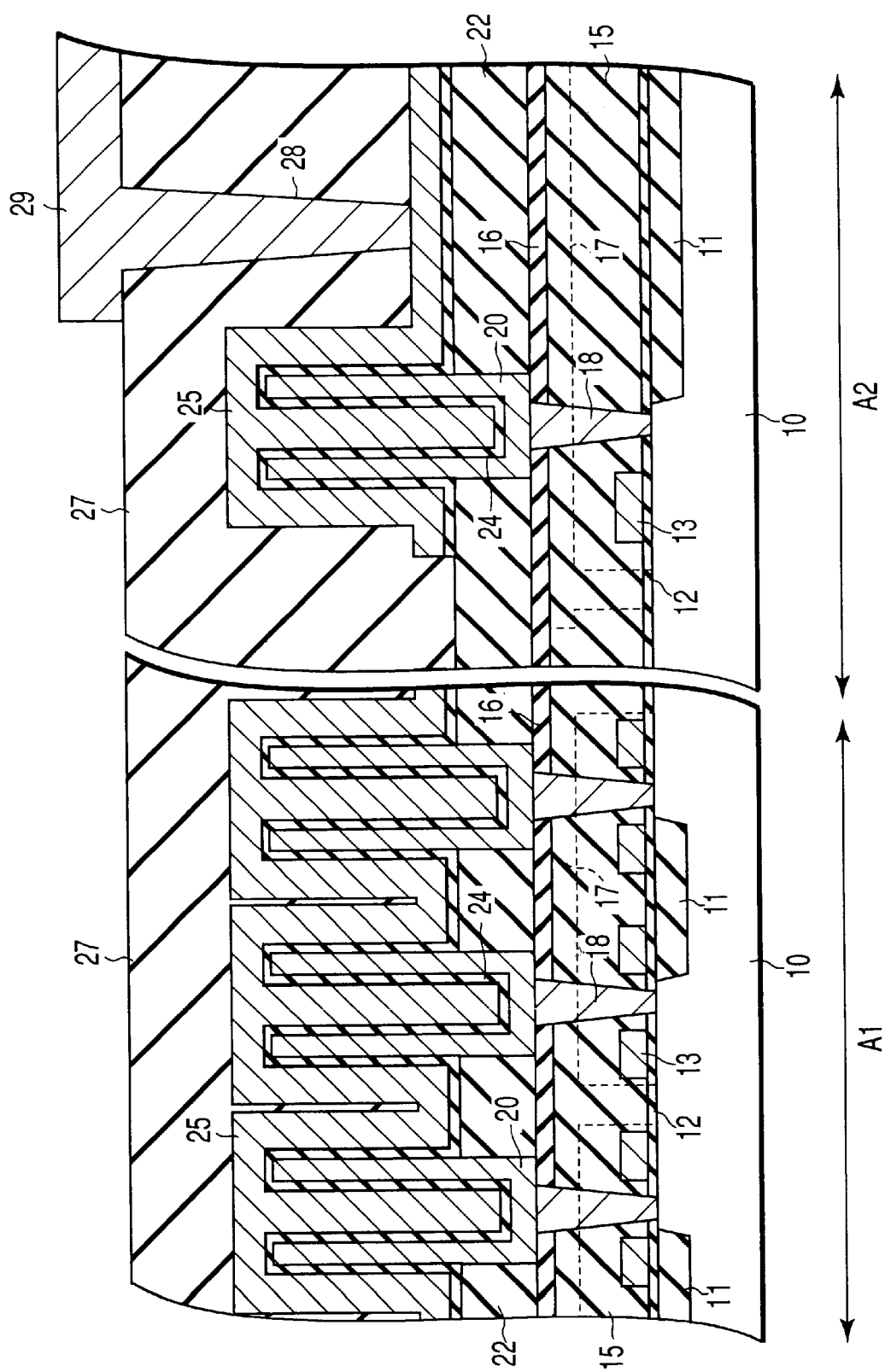
FIG. 1 is a cross sectional view of a conventional DRAM.
Figure 2A:
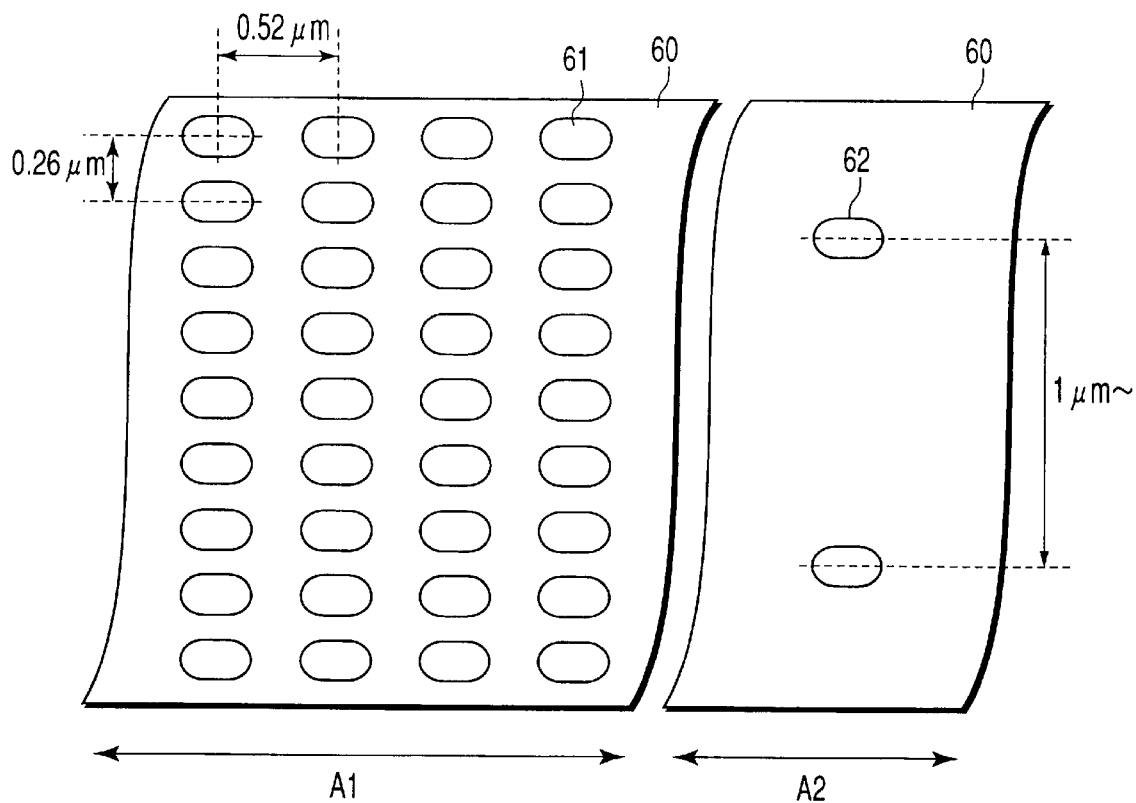
FIG. 2A is a plan view of the conventional DRAM.
Figures 2B, 2C:
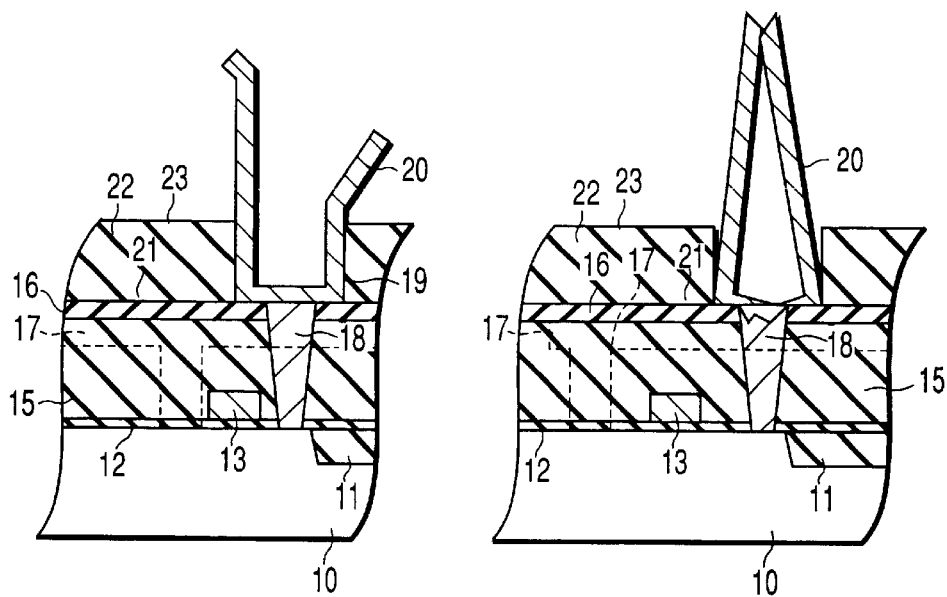
FIGS. 2B and 2C are cross sectional views of an anti-fuse provided in the conventional DRAM.

The plan view of the DRAM in FIG. 2A shows the structure common in respect to arrangement of the capacitors to the DRAMs according to the first to fourth embodiments (Of course, there are instances where the size of the cell capacitor is not equal to the fuse capacitor, in this invention). Thus, the individual fuse capacitors are basically isolated in the peripheral area, but it is required in some cases to form dummy capacitors around the isolated fuse capacitors in order to attain a sufficiently large process margin. Even in this case, however, the capacitors actually functioning as the fuse capacitors are sparsely arranged in comparison with the cell capacitors and this invention can also be applied to this case.

One of the main points of this invention is that both of the finely patterned structure and the large capacitances of the capacitors are simultaneously attained in the memory cell array area and the capacitors in the peripheral area are formed to have the stable structure. Therefore, in the second to fourth embodiments, combinations of the double-surface-cylinder type capacitors and double-surface-concave type capacitors, outer-surface-pillar type capacitors and double-surface-cylinder type capacitors, and outer-surface-pillar type capacitors and double-surface-concave type capacitors are shown as the combination of the capacitor structures, but the combination of the capacitor structures is not limited to the above combinations and combinations of other type capacitors can be used. Further, the DRAM is explained as an example in the above embodiments, but this invention can be applied to a high-dielectric-constant RAM and logic/DRAM hybrid circuit.

In the anti-fuse, voltage higher than the threshold voltage is applied across the two electrodes to break down the capacitor insulating film when information is written. In order to lower the write voltage, it is preferable to make the dielectric breakdown voltage of the fuse capacitor lower than that of the cell capacitor. On the other hand, the cell capacitor is required to have high reliability and high dielectric breakdown voltage. According to the third and fourth embodiments, the film thickness of the capacitor insulating film of the fuse capacitor in the cylinder bottom portion can be made smaller than that of the cell capacitor, and therefore, the above requirement can be satisfied.

Other structures for lowering the dielectric breakdown voltage of the fuse capacitor are explained with reference to FIGS. 12A to 12D.

Figure 12A:
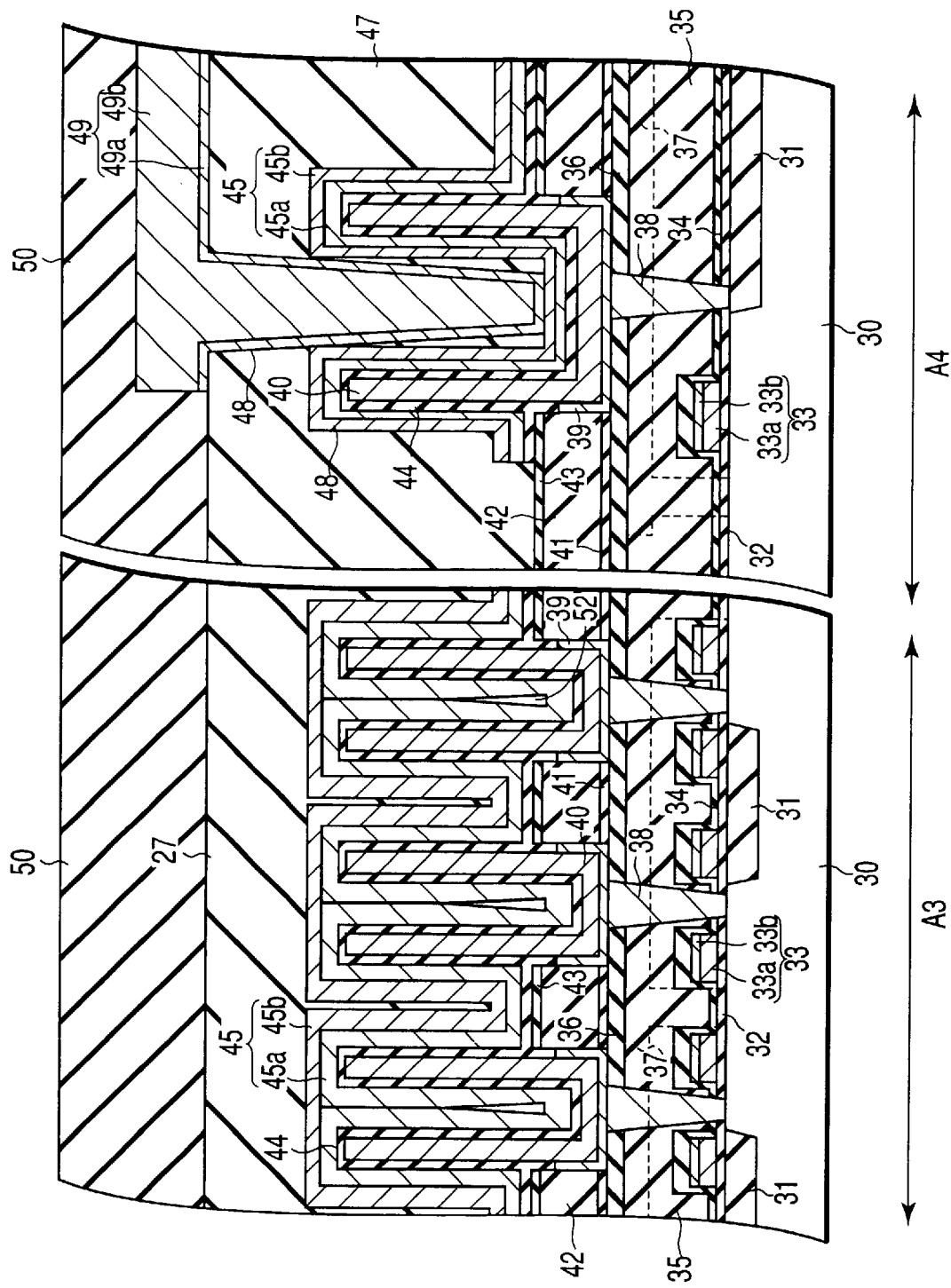
FIGS. 12A to 12D are cross sectional views showing a DRAM according to a modification of the above embodiment of this invention.
Figure 12B:
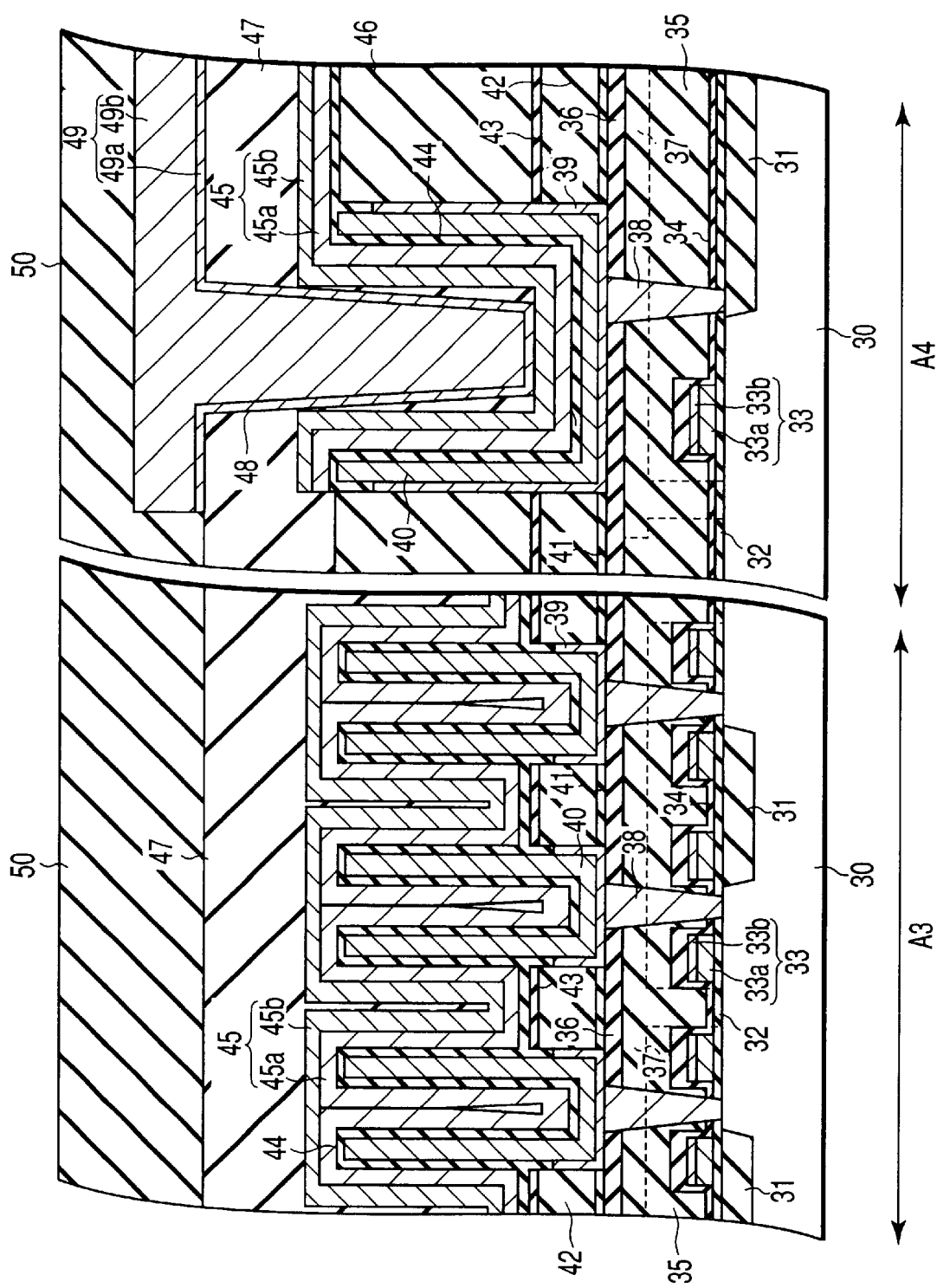
Figure 12C:
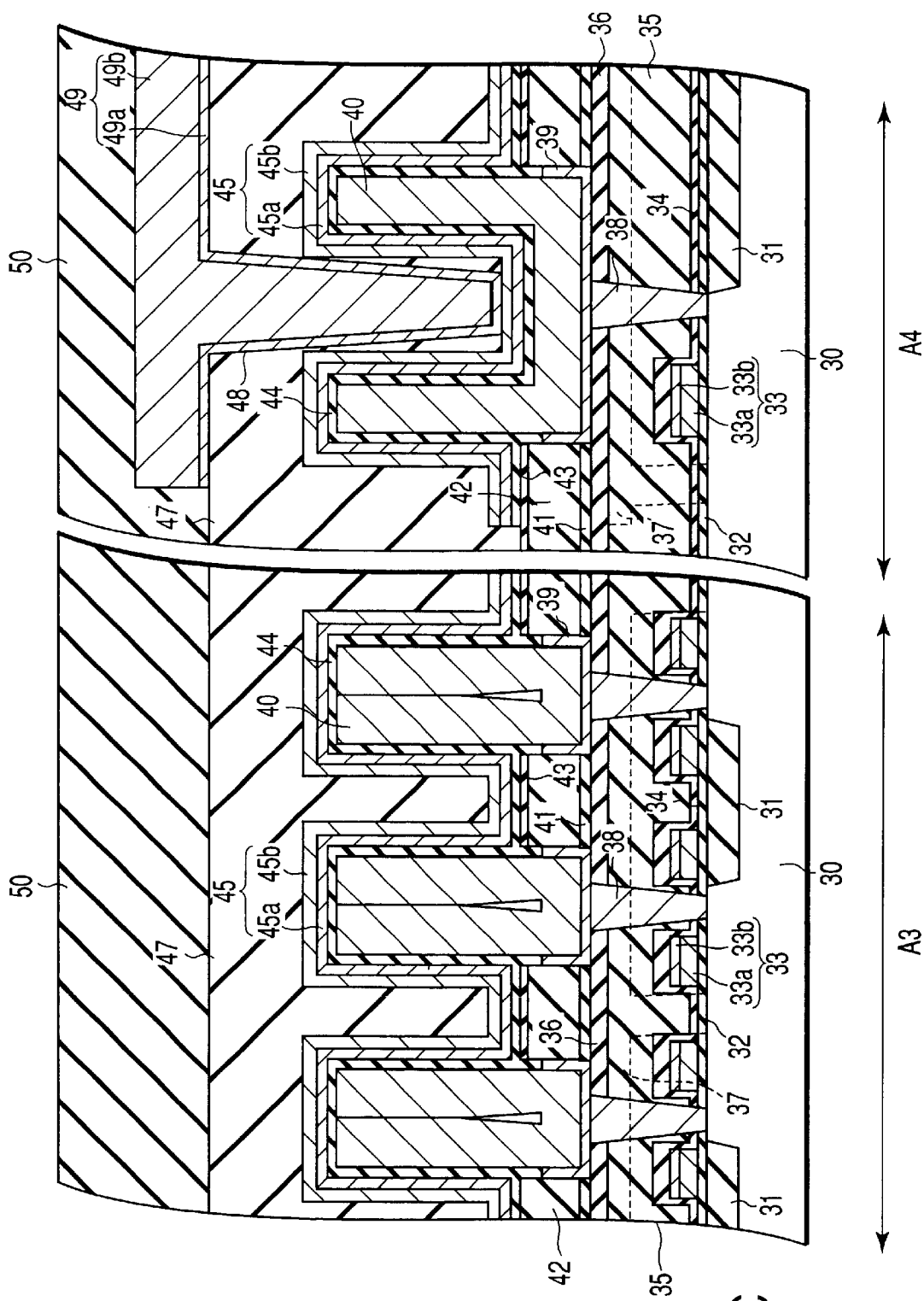
Figure 12D:
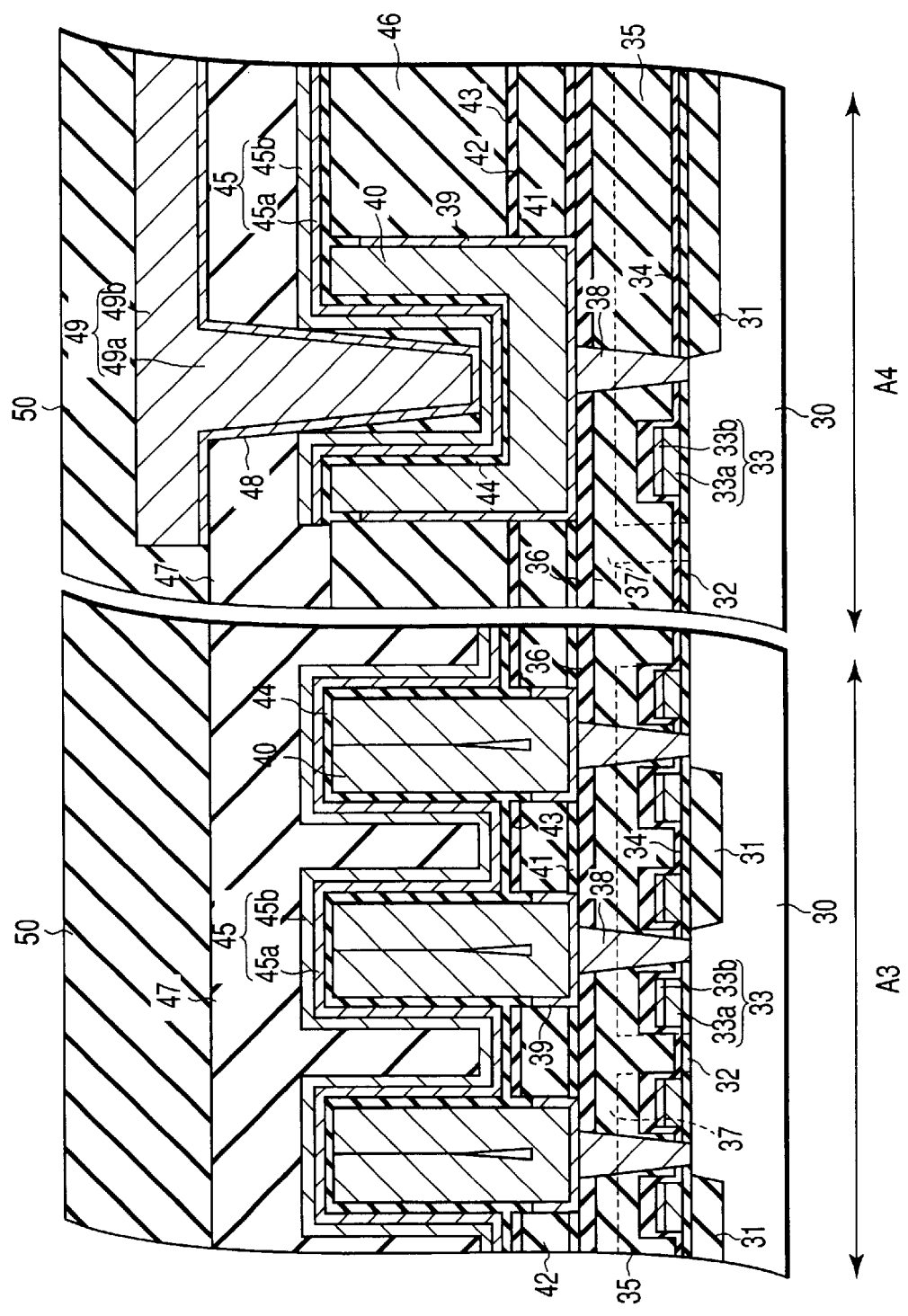

FIG. 12A is a cross sectional view showing a DRAM having double-surface-cylinder type stacked capacitors as the cell capacitors and fuse capacitors, FIG. 12B is a cross sectional view showing a DRAM having double-surface-concave type stacked capacitors as the fuse capacitors, FIG. 12C is a cross sectional view showing a DRAM having outer-surface-pillar type stacked capacitors as the cell capacitors and double-surface-cylinder type stacked capacitors as the fuse capacitors, and 12D is a cross sectional view showing a DRAM having outer-surface-pillar type stacked capacitors as the cell capacitors and double-surface-concave type stacked capacitors as the fuse capacitors.

As shown in FIGS. 12A to 12D, a contact hole 48 is formed in contact with the bottom portion of a cylinder of the fuse capacitor in each DRAM. With this structure, damage is applied to the capacitor insulating film in the etching step at the time of forming the contact hole or in the step of filling metal into the contact hole. Therefore, the characteristic of the capacitor insulating film lying directly below the contact hole is deteriorated so that the dielectric breakdown voltage of the fuse capacitor can be lowered. As a result, only the characteristic of the fuse capacitor can be degraded and the write voltage to the fuse capacitor can be lowered while the reliability of the cell capacitor is maintained. At the same time, the occupied area of the anti-fuse can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a contact plug formed in a first interlayer insulating film on a semiconductor substrate;
   a second interlayer insulating film formed on the first interlayer insulating film and having an opening reaching the first interlayer insulating film, said contact plug being exposed to the bottom portion of the opening;
   a liner film formed on bottom and side surfaces of the opening;
   a stacked capacitor lower electrode formed to be at least partly filled in the opening, said capacitor lower electrode being formed in contact with said first and second interlayer insulating films with said liner film disposed therebetween and said capacitor lower electrode being formed of a platinum group material;
   a capacitor insulating film formed on said capacitor lower electrode, said capacitor insulating film being formed of a high-dielectric-constant material; and
   a capacitor upper electrode formed on said capacitor insulating film; and
   wherein a portion of said liner film which is formed on the side surface of the opening formed in said second insulating film is recessed by a depth equal to the film thickness of said capacitor insulating film from the opening end face of the opening and a recessed portion is filled with said capacitor insulating film.

2. The semiconductor device according to claim 1, wherein a portion of said liner film which is formed on the side surface of the opening formed in said second insulating film is recessed by a depth equal to at least twice the film thickness of said capacitor insulating film from the opening end face of the opening and a recessed portion is filled with said capacitor insulating film.

3. The semiconductor device according to claim 1, wherein the liner film contains at least one selected from a group consisting of titanium nitride, tungsten nitride and tantalum nitride as a main material.

4. A semiconductor device comprising:

first capacitor structures formed in a first area of a first interlayer insulating film on a semiconductor substrate, each of said first capacitor structures having a first capacitor lower electrode formed on the first interlayer insulating film, a first capacitor insulating film formed on the first capacitor lower electrode and a first capacitor upper electrode formed on the first capacitor insulating film; and second capacitor structures formed in a second area of the first interlayer insulating film which is different from the first area, each of said second capacitor structures having a second capacitor lower electrode formed on the first interlayer insulating film and formed of the same material as the first capacitor lower electrode, a second capacitor insulating film formed on the second capacitor lower electrode and formed of the same material as the first capacitor insulating film and a second capacitor upper electrode formed on the second capacitor insulating film and formed of the same material as the first capacitor upper electrode, the shortest distance between said second capacitor structures being not smaller than twice the shortest distance between said first capacitor structures and the relative structures of the second capacitor lower electrode and second capacitor upper electrode with respect to the second capacitor insulating film being different from the relative structures of the first capacitor lower electrode and first capacitor upper electrode with respect to the first capacitor insulating film.

5. The semiconductor device according to claim 4, further comprising a second interlayer insulating film formed on the second area of said first interlayer insulating film and having openings formed therein to reach said first interlayer insulating film;

wherein each of said first capacitor structures is a cylinder type stacked capacitor in which the first capacitor lower electrode has a cylindrical form having an opening in the upper surface thereof and the first capacitor insulating film is formed on bottom, inner peripheral and outer peripheral surfaces of the first capacitor lower electrode and each of said second capacitor structures is an concave type stacked capacitor in which the second capacitor lower electrode has a cylindrical form formed on bottom and side surfaces of the each opening of said second interlayer insulating film and the second capacitor insulating film is formed on bottom and inner peripheral surface of the second capacitor lower electrode.

6. The semiconductor device according to claim 6, further comprising a third interlayer insulating film formed on the first interlayer insulating film between adjacent ones of said first capacitor structures in the first area and between adjacent ones of said second capacitor structures in the second area, said third interlayer insulating film having film thickness to reach intermediate height portions of the first and second capacitor lower electrodes and said third interlayer insulating film in the second area being disposed between the first and second interlayer insulating films; and a liner film disposed between the first, second capacitor lower electrodes and the first interlayer insulating film and between the first, second capacitor lower electrodes and said third interlayer insulating film, said liner film disposed between the first capacitor lower electrode and said third interlayer insulating film being recessed by a depth equal to at least the film thickness of the first capacitor insulating film from the upper surface of said third interlayer insulating film, said first capacitor insulating film being formed to fill areas in which said liner film is recessed from the upper surface of said third interlayer insulating film, said liner film disposed between the second capacitor lower electrode and said third interlayer insulating film being recessed by a depth equal to at least the film thickness of the second capacitor insulating film from the upper surface of said second interlayer insulating film, said second capacitor insulating film being formed to fill areas in which said liner film is recessed from the upper surface of said second interlayer insulating film.

7. The semiconductor device according to claim 4, wherein each of said first capacitor structures is an outer-surface-pillar type stacked capacitor in which the first capacitor lower electrode has a pillar form and the first capacitor insulating film is formed on an outer surface of the first capacitor lower electrode and each of said second capacitor structures is a cylinder type stacked capacitor in which the second capacitor lower electrode has a cylindrical form having an opening in the upper surface thereof and the second capacitor insulating film is formed on bottom, inner peripheral and outer peripheral surfaces of the second capacitor lower electrode.

8. The semiconductor device according to claim 7, further comprising a second interlayer insulating film formed on the first interlayer insulating film between adjacent ones of said first capacitor structures in the first area and between adjacent ones of said second capacitor structures in the second area, said second interlayer insulating film having a film thickness to reach intermediate height portions of the first and second capacitor lower electrodes; and a liner film disposed between the first, second capacitor lower electrodes and the first interlayer insulating film and between the first, second capacitor lower electrodes and said second interlayer insulating film, said liner film disposed between the first, second capacitor lower electrodes and said second interlayer insulating film being recessed by a depth equal to respectively at least the film thickness of the first, second capacitor insulating films from the upper surface of said second interlayer insulating film, said first, second capacitor insulating films being formed to respectively fill areas in which said liner film is recessed from the upper surfaces of said second interlayer insulating film in the first and second areas.

9. The semiconductor device according to claim 7, wherein the film thickness of the thinnest portion of the second capacitor insulating film is smaller than that of the thinnest portion of said first capacitor insulating film.

10. The semiconductor device according to claim 4, further comprising a second interlayer insulating film formed on the second area of said first interlayer insulating film and having openings formed therein to reach said first interlayer insulating film;

wherein each of said first capacitor structures is an outer-surface-pillar type stacked capacitor in which the first capacitor lower electrode has a pillar form and the first capacitor insulating film is formed on an outer surface of the first capacitor lower electrode and each of said second capacitor structures is a concave type stacked capacitor in which the second capacitor lower electrode has a cylindrical form formed on bottom and side surfaces of the opening of said second interlayer insulating film and the second capacitor insulating film is formed on bottom and inner peripheral surfaces of the second capacitor lower electrode.

11. The semiconductor device according to claim 10, further comprising
   a third interlayer insulating film formed on the first interlayer insulating film between adjacent ones of said first capacitor structures in the first area and between adjacent ones of said second capacitor structures in the second area, said third interlayer insulating film having film thickness to reach intermediate height portions of the first and second capacitor lower electrodes and said third interlayer insulating film in the second area being disposed between the first and second interlayer insulating films; and
   a liner film disposed between the first, second capacitor lower electrodes and the first interlayer insulating film and between the first, second capacitor lower electrodes and said third interlayer insulating film, said liner film disposed between the first capacitor lower electrode and said third interlayer insulating film being recessed by a depth equal to at least the film thickness of the first capacitor insulating film from the upper surface of said third interlayer insulating film, said first capacitor insulating film being formed to fill areas in which said liner film is recessed from the upper surface of said third interlayer insulating film, said liner film disposed between the second capacitor lower electrode and said third interlayer insulating film being recessed by a depth equal to at least the film thickness of the second capacitor insulating film from the upper surface of said second interlayer insulating film, said second capacitor insulating film being formed to fill areas in which said liner film is recessed from the upper surface of said second interlayer insulating film.

12. The semiconductor device according to claim 10, wherein the film thickness of the thinnest portion of the second capacitor insulating film is smaller than that of the thinnest portion of said first capacitor insulating film.

13. The semiconductor device according to claim 4, wherein said first and second areas are a memory cell array area and a peripheral circuit area other than the memory cell array area, respectively, and said first and second capacitor structures formed in the first and second areas are cell capacitors of memory cells and fuse capacitors of anti-fuses, respectively.

14. The semiconductor device according to claim 4, wherein said first, second capacitor insulating films are high-dielectric-constant films and the first, second capacitor lower electrodes are formed of a material belonging to a platinum group.

15. A semiconductor device comprising:
   a lower electrode of cylindrical form formed on a semiconductor body and having an opening in the upper surface thereof;
   an insulating film formed on at least inner peripheral and bottom surfaces of said lower electrode;
   a upper electrode formed on said insulating film with a hollow portion formed in an inner portion of the cylindrical form;
   an interlayer insulating film formed on said upper electrode; and
   a contact plug formed in said interlayer insulating film and electrically connected to said upper electrode, said contact plug having a structure in which a contact hole extending from the upper surface of said interlayer insulating film and reaching said upper electrode lying in the bottom portion of the inner portion of the cylindrical form is filled with a conductive material.

16. A semiconductor device comprising:
   a contact plug formed in a first interlayer insulating film on a semiconductor substrate;
   a second interlayer insulating film formed on the first interlayer insulating film and having an opening reaching the first interlayer insulating film, said contact plug being exposed to the bottom portion of the opening;
   a stacked capacitor lower electrode formed to be at least partly filled in the opening, said capacitor lower electrode being formed of a platinum group material;
   a capacitor insulating film formed on said capacitor lower electrode, said capacitor insulating film being formed of a high-dielectric constant material;
   a capacitor upper electrode formed on said capacitor insulating film; and
   a liner film formed between the first interlayer insulating film and the capacitor lower electrode and between the second interlayer insulating film and capacitor lower electrode, the liner film between the second interlayer insulating film and the capacitor lower electrode including an upper surface leveled lower than an upper surface of the second interlayer insulating film by at least a thickness of the capacitor insulating film, and the capacitor lower electrode being adjacent to the second interlayer insulating film with the liner film and the capacitor insulating film interposed therebetween.

17. The semiconductor device according to claim 16, wherein the liner film between the second interlayer insulating film and the capacitor lower electrode includes an upper surface leveled lower than an upper surface of the second interlayer insulating film by at least twice or more a thickness of the capacitor insulating film.

18. The semiconductor device according to claim 16, wherein the liner film contains at least one selected from a group consisting of titanium nitride, tungsten nitride and tantalum nitride as a main material.

19. A semiconductor device comprising:
   a contact plug formed in a first interlayer insulating film on a semiconductor substrate;
   a second interlayer insulating film formed on the first interlayer insulating film and having an opening reaching the first interlayer insulating film, said contact plug being exposed to the bottom portion of the opening;
   first and second capacitance element formed to be at least partly filled in the opening
   the first capacitance element including:
      a stacked capacitor lower electrode formed to be at least partly filled in the opening, said capacitor lower electrode being formed of a platinum group material;
      a capacitor insulating film formed on said capacitor lower electrode, said capacitor insulating film being formed of a high-dielectric constant material; and
      a capacitor upper electrode formed on said capacitor insulating film the second capacitance element including:
      the stacked capacitor lower electrode;
      the capacitor insulating film; and
      a liner film formed between the first interlayer insulating film and the capacitor lower electrode and between the second interlayer insulating film and capacitor lower electrode, the capacitor insulating film located between the capacitor upper electrode and the liner film having a thickness at least twice or more of a thickness of that located between the capacitor upper electrode and the capacitor lower electrode.

20. A semiconductor device comprising:

first capacitor structures formed in a first area of a first interlayer insulating film on a semiconductor substrate, each of said first capacitor structures having a first capacitor lower electrode formed on the first interlayer insulating film, a first capacitor insulating film formed on the first capacitor lower electrode and a first capacitor upper electrode formed on the first capacitor insulating film;

second capacitor structures formed in a second area of the first interlayer insulating film which is different from the first area, each of said second capacitor structures having a second capacitor lower electrode formed on the first interlayer insulating film and formed of the same material as the first capacitor lower electrode, a second capacitor insulating film formed on the second capacitor lower electrode and formed of the same material as the first capacitor insulating film and a second capacitor upper electrode formed on the second capacitor insulating film and formed of the same material as the first capacitor upper electrode, the shortest distance between said second capacitor structures being not smaller than twice the shortest distance between said first capacitor structures and the relative structures of the second capacitor lower electrode and second capacitor upper electrode with respect to the second capacitor insulating film being different from the relative structures of the first capacitor lower electrode and first capacitor upper electrode with respect to the first capacitor insulating film;

a second interlayer insulating film formed on the first interlayer insulating film between adjacent ones of the first capacitor structures in the first area;

a third interlayer insulating film formed on the first interlayer insulating film between adjacent one of the second capacitor structures in the second area;

a first liner film disposed between the first interlayer insulating film and the first capacitor lower electrode and between the second interlayer insulating film and the first capacitor lower electrode, the first liner film between the second interlayer insulating film and the first capacitor lower electrode including an upper surface leveled lower than an upper surface of the second interlayer insulating film by at least a thickness of the first capacitor insulating film, and the first capacitor lower electrode being adjacent to the second interlayer insulating film with the first liner film and the first capacitor insulating film interposed therebetween; and a second liner film disposed between the first interlayer insulating film and the second capacitor lower electrode and between the third interlayer insulating film and the second capacitor lower electrode, the second liner film between the third interlayer insulating film and the second capacitor lower electrode including an upper surface leveled lower than an upper surface of the third interlayer insulating film by at least a thickness of the second capacitor insulating film, and the second capacitor lower electrode being adjacent to the third interlayer insulating film with the second liner film and the second capacitor insulating film interposed therebetween.

21. The semiconductor device according to claim 20, wherein the second interlayer insulating film has a thickness to reach intermediate height portion of the first capacitor lower electrode, the third interlayer insulating film has a thickness to reach upper portion of the second capacitor lower electrode, each of the first capacitor structure is cylinder type in which the first capacitor lower electrode has a cylindrical form having an opening in the upper surface thereof and the first capacitor insulating film is formed on bottom, inner peripheral and outer peripheral surfaces of the first capacitor lower electrode; and each of the second capacitor structure is concave type in which the second capacitor lower electrode has a cylindrical form formed on the first interlayer insulating film and side surfaces of the third interlayer insulating film and the second capacitor insulating film is formed on bottom and inner peripheral surface of the second capacitor lower electrode.

22. The semiconductor device according to claim 20, wherein the second and third interlayer insulating film has a thickness to reach intermediate height portion of the first and second capacitor lower electrode, respectively, each of the first capacitor structure is outer-surface-pillar type in which the first capacitor lower electrode has a pillar form and the first capacitor insulating film is formed on an outer surface of the first capacitor electrode; and each of the second capacitor structure is cylinder type in which the second capacitor lower electrode has a cylindrical form having an opening in the upper surface thereof and the second capacitor insulating film is formed on bottom, inner peripheral and outer peripheral surfaces of the second capacitor lower electrode.

23. The semiconductor device according to claim 22, wherein the film thickness of the thinnest portion of the second capacitor insulating film is smaller than that of the thinnest portion of said first capacitor insulating film.

24. The semiconductor device according to claim 20, wherein the second interlayer insulating film has a thickness to reach intermediate height portion of the first capacitor lower electrode, the third interlayer insulating film has a thickness to reach upper portion of the second capacitor lower electrode, each of the first capacitor structure is outer-surface-pillar type in which the first capacitor lower electrode has a pillar form and the first capacitor insulating film is formed on an outer surface of the first capacitor electrode, and each of the second capacitor structure is concave type in which the second capacitor lower electrode has a cylindrical form formed on the first interlayer insulating film and side surfaces of the third interlayer insulating film and the second capacitor insulating film is formed on bottom and inner peripheral surface of the second capacitor lower electrode.

25. The semiconductor device according to claim 24, wherein the film thickness of the thinnest portion of the second capacitor insulating film is smaller than that of the thinnest portion of said first capacitor insulating film.

26. The semiconductor device according to claim 20, wherein said first and second areas are a memory cell array area and a peripheral circuit area other than the memory cell array area, respectively, and said first and second capacitor structures formed in the first and second areas are cell capacitors of memory cells and fuse capacitors of anti-fuses, respectively.

27. The semiconductor device according to claim 20, wherein said first, second capacitor insulating films are high-dielectric-constant films and the first, second capacitor lower electrodes are formed of a material belonging to a platinum group.

* * * * *

UNITED STATES PATENT AND TRADEMARK OFFICE
CERTIFICATE OF CORRECTION

PATENT NO.     : 6,563,157 B2                                    Page 1 of 1
DATED          : May 13, 2003
INVENTOR(S)    : Yoshiaki Fukuzumi It is certified that error appears in the above-identified patent and that said Letters Patent is hereby corrected as shown below:

<u>Title page,</u>
Item [76], Inventor, "c/o Intellectual Property Division, Kabushiki Kaisha Toshiba, 1-1 Shibura 1-chome, Minato-ku, Tokyo 1-5-8001 (JP)" has been replaced with
-- Yokohama, (JP) --;
Item [73], Assignee, "Kabushiki Kaisha Toshiba, Minato-ku, (JP)" has been added.

Signed and Sealed this

Fourth Day of November, 2003

JAMES E. ROGAN
*Director of the United States Patent and Trademark Office*